United States Patent
Paz de Araujo et al.

(10) Patent No.: US 7,459,318 B2
(45) Date of Patent: Dec. 2, 2008

(54) FERROELECTRIC AND HIGH DIELECTRIC CONSTANT INTEGRATED CIRCUIT CAPACITORS WITH THREE-DIMENSIONAL ORIENTATION FOR HIGH-DENSITY MEMORIES, AND METHOD OF MAKING THE SAME

(75) Inventors: Carlos A. Paz de Araujo, Colorado Springs, CO (US); Larry D. McMillan, Colorado Springs, CO (US); Narayan Solayappan, Colorado Springs, CO (US); Vikram Joshi, Colorado Springs, CO (US)

(73) Assignee: Symetrix Corporation, Colorado Springs, CO (US)

(*) Notice: Subject to any disclaimer, the term of this patent is extended or adjusted under 35 U.S.C. 154(b) by 232 days.

(21) Appl. No.: 11/411,767

(22) Filed: Apr. 26, 2006

(65) Prior Publication Data

US 2006/0194348 A1    Aug. 31, 2006

Related U.S. Application Data

(60) Division of application No. 10/626,413, filed on Jul. 24, 2003, now Pat. No. 7,075,134, which is a continuation-in-part of application No. 09/998,469, filed on Nov. 29, 2001, now Pat. No. 6,781,184, and a continuation-in-part of application No. 10/302,441, filed on Nov. 22, 2002, now Pat. No. 6,815,223, and a continuation-in-part of application No. 10/302,442, filed on Nov. 22, 2002, now abandoned.

(51) Int. Cl.
*H01L 21/00* (2006.01)

(52) U.S. Cl. .................. 438/3; 438/241; 257/E21.021; 257/E21.664

(58) Field of Classification Search .............. 438/3, 438/241
See application file for complete search history.

(56) References Cited

U.S. PATENT DOCUMENTS

| | | | |
|---|---|---|---|
| 5,046,043 | A | 9/1991 | Miller et al. |
| 5,227,855 | A | 7/1993 | Momose |
| 5,434,102 | A | 7/1995 | Watanabe et al. |
| 5,466,629 | A | 11/1995 | Mihara et al. |
| 5,468,684 | A | 11/1995 | Yoshimori et al. |

(Continued)

FOREIGN PATENT DOCUMENTS

WO    WO-93/12542    6/1993

*Primary Examiner*—Alexander G Ghyka
(74) *Attorney, Agent, or Firm*—Patton Boggs LLP

(57) ABSTRACT

A three-dimensional ("3-D") memory capacitor comprises a bottom electrode, a ferroelectric thin film, and a top electrode that conform to a 3-D surface of an insulator layer. The capacitance area is greater than the horizontal footprint area of the capacitor. Preferably, the footprint of the capacitor is less than 0.2 nm$^2$, and the corresponding capacitance area is typically in a range of from 0.4 nm$^2$ to 1.0 nm$^2$ The ferroelectric thin film preferably has a thickness not exceeding 60 nm. A capacitor laminate including the bottom electrode, ferroelectric thin film, and the top electrode preferably has a thickness not exceeding 200 nm. A low-thermal-budget MOCVD method for depositing a ferroelectric thin film having a thickness in a range of from 30 nm to 90 nm includes an RTP treatment before depositing the top electrode and an RTP treatment after depositing the top electrode and etching the ferroelectric layer.

13 Claims, 12 Drawing Sheets

U.S. PATENT DOCUMENTS

| | | |
|---|---|---|
| 5,519,234 A | 5/1996 | Paz de Araujo et al. |
| 6,110,531 A | 8/2000 | Paz de Araujo et al. |
| 6,180,971 B1 | 1/2001 | Maejima |
| 6,225,656 B1 * | 5/2001 | Cuchiaro et al. ............ 257/295 |
| 6,245,580 B1 | 6/2001 | Solayappan et al. |
| 6,258,733 B1 | 7/2001 | Solayappan et al. |
| 6,326,315 B1 | 12/2001 | Uchiyama et al. |
| 6,506,643 B1 * | 1/2003 | Hsu et al. ................... 438/240 |
| 2003/0030079 A1 | 2/2003 | Hsu et al. |
| 2003/0129796 A1 | 7/2003 | Bruchhaus et al. |

* cited by examiner

FERROELECTRIC AND HIGH DIELECTRIC CONSTANT INTEGRATED CIRCUIT CAPACITORS WITH THREE-DIMENSIONAL ORIENTATION FOR HIGH-DENSITY MEMORIES, AND METHOD OF MAKING THE SAME

CROSS-REFERENCE TO RELATED APPLICATIONS

This Application is a divisional of U.S. patent application Ser. No. 10/626,413 filed on Jul. 24, 2003, which is a continuation-in-part application under 37 CFR 1.53(b) of U.S. patent application Ser. No. 10/302,441 filed Nov. 22, 2002, and U.S. patent application Ser. No. 10/302,442 filed Nov. 22, 2002, and U.S. patent application Ser. No. 09/998,469 filed Nov. 29, 2001, which are hereby incorporated by reference.

BACKGROUND OF THE INVENTION

1. Field of the Invention

The present invention pertains to the field of high-density memories and, particularly, memories that utilize ferroelectric capacitors.

2. Statement of the Problem

Ferroelectric memories are nonvolatile memories offering performance and densification advantages over conventional nonvolatile memories, such as electrically erasable programmable read only memories (EEPROM) and erasable programmable read only memories (EPROM). U.S. Pat. No. 5,046,043 issued Sep. 3, 1991 to Miller et al. shows a 1T/1C memory cell having a lead zirconium titanate (PZT) ferroelectric capacitor alternatively stacked over a contact hole or within a conduit leading to the transistor source/drain region. The configuration of the Miller et al. ferroelectric memory cells is similar to that of a conventional dynamic random access memory (DRAM) cell. However, the operation and timing are different, particularly in that the cell does not need to be refreshed as often because memory storage is relatively permanent. A refresh operation is one in which the memory logic senses the state of the memory cells and writes the state of the memory that has been sensed back to the memory cells in an identical format to that which has been sensed.

Permanence or nonvolatility of memory storage results from the ability of ferroelectric materials to polarize in the presence of an applied electric field, and to retain that polarization state once the field is removed. Thus, a logical one or zero is represented by the polarization state of the ferroelectric material in the capacitor. Memory sense amplifiers and logic circuits are used to determine the polarization state for memory operations in a conventional manner for ferroelectric memories.

U.S. Pat. No. 5,227,855 issued Jul. 13, 1993 to Hisayo S. Momose shows a one-transistor one-capacitor (1T/1C) memory cell where a PZT ferroelectric capacitor resides in a contact hole contacting a source/drain region of the field effect transistor. The purpose of placing the capacitor in the contact hole is to make the memory cell flatter and facilitate the formation of metal wiring layers in the contact holes. A discussion of the prior art in the Momose patent shows the ferroelectric capacitor located above the transistor gate with a wiring layer extending to the side of the gate region for contact with the transistor source/drain region. The thin films in all of these ferroelectric capacitors have a horizontal orientation parallel to that of the underlying substrate. The discussion below shows that designs to place ferroelectric capacitors in transistor contact holes is, to a certain extent, wishful thinking because the contact holes must be exceptionally large.

In high-density memories, a significant problem with placing the ferroelectric capacitor in the contact hole leading to the transistor source-drain region is that the ferroelectric capacitor must be contained within limited surface area due to the small overall size of the device. Ferroelectric polarization depends primarily on crystal grain surface area, which is typically measured in units of microcoulombs per square centimeter. These grains are sometimes referred to as ferroelectric domains. While increasing the thickness of the ferroelectric layer can increase polarization by increasing the number of vertically stacked domains, increasing the thickness also reduces the applied electric field at some of the domains. As a result, the applied field is greater for some domains and less for other domains. A reduced field is less effective at switching domains, and the unequal switching ability in thicker films results in some domains being incompletely switched.

Ferroelectric films, if left in a polarized state, tend to retain their polarization state for periods of weeks, months, or years; however, in actual use, ferroelectric films retain their polarization states for much shorter times because they are sensitive to disturb voltage pulses. Disturb voltage pulses are unidirectional voltage pulses that switch the polarization state in only a portion of the ferroelectric domains. Current ferroelectric memory architecture requires ferroelectric materials to be exposed to disturb voltage pulses. Disturb voltage pulses have been shown to degrade remnant polarization in PZT capacitors having a $1.84 \times 10^{-4}$ cm$^2$ surface area to fifty percent of original levels after $10^7$ cycles of 1.0V pulses 1 µs apart with 100 ns rise and fall times. See Moore et al., "The Effect of Small Voltage Pulses on Retained Polarization in Ferroelectric Capacitors" (undated). Thus, the combined effects of low polarization due to small capacitance area together with disturb voltage pulsing requires ferroelectric memories to be refreshed. Even if the disturb pulses do not switch the ferroelectric, sense operations are increasingly prone to errors because the retained polarization has a lower magnitude that is more difficult to read without switching the polarization state of the ferroelectric material.

One way to avoid the problems that are caused by small capacitance area is to provide a capacitor having a large surface area. PCT Publication No. WO 93/12542 published Jun. 24, 1993 to Araujo et al. shows a 1T/1C memory cell having a horizontally oriented, vertically stacked ferroelectric capacitor with a much greater surface area than the transistor component of the memory cell. The ferroelectric capacitor covers a surface area off to the side of the transistor, and only partially overlaps the transistor. The overall surface area of the capacitor is much greater than the contact hole leading to the transistor active area. This semi-overlapping design uses a layered superlattice material as the ferroelectric. The need for ferroelectric capacitors having relatively large surface areas in high-density memories is apparent from the WO 93/12542 memory cell because the ferroelectric capacitor occupies several times the surface area of the transistor device even though layered superlattice materials have better polarizabilities than do comparable PZT films. A further reason for placement of the ferroelectric capacitor off to the side of the transistor is that the metals in the ferroelectric material might otherwise be more prone to diffuse into the transistor active area where they interfere with the intended n and p dopants.

FIG. 1 shows a cross-sectional view of another typical conventional nonvolatile ferroelectric memory 100 of the prior art. Ferroelectric memory capacitor 128 includes bottom electrode 122, ferroelectric thin film 124, and top electrode 126, which are substantially parallel to underlying semiconductor substrate 102. The effective capacitance area of memory capacitor 128 is generally determined by the smallest horizontal surface area of the active capacitor elements. In capacitor 128, active capacitor elements bottom electrode 122, ferroelectric thin film 124, and top electrode 126 have substantially the same horizontal surface area. To increase the polarizability of capacitor 128 of the prior art, it would be necessary to increase the horizontal surface area of the active capacitor elements. This would increase the horizontal surface area ("footprint") of capacitor 128, thereby decreasing the density of memory 100.

The ever-increasing density of integrated circuits, however, requires a corresponding decrease in the horizontal surface area of memory cells, while maintaining good electronic properties, such as good polarizability and low coercive voltage. Thus, there remains a need to provide a ferroelectric capacitor for high-density memories where the footprint of the capacitor is reduced with a corresponding increase in memory density.

BRIEF SUMMARY OF THE INVENTION

The present invention helps to overcome some of the problems outlined above by providing a ferroelectric capacitor device that occupies a small horizontal surface area ("footprint") while maintaining sufficient capacitance area to provide good electronic properties. This advantage is obtained by forming the active elements of a ferroelectric memory capacitor in a shape having substantial directional components that are perpendicular to the underlying substrate, as opposed to a planar orientation that is predominantly parallel to the underlying substrate. A capacitor dielectric thin film comprising ferroelectric material is preferably fabricated using an MOCVD technique, which enables the deposition of an ultra-thin film having a thickness not exceeding 80 nanometers (nm) and good step-coverage conforming to a three-dimensional (" 3-D") shape of a memory capacitor.

In one aspect, a ferroelectric integrated circuit memory in accordance with the invention comprises a 3-D capacitor laminate, the capacitor laminate comprising a bottom electrode, a ferroelectric film, and a top electrode, wherein the 3-D capacitor laminate comprises a 3-D shape having substantial directional components in three mutually orthogonal planes. Preferably, the ferroelectric film has a thickness not exceeding 80 nm, and more preferably, not exceeding 60 nm. Preferably, the ferroelectric film comprises ferroelectric layered superlattice material. In some embodiments, the ferroelectric film comprises strontium bismuth tantalate or strontium bismuth tantalum niobate. In another aspect, a capacitor laminate has a thickness not exceeding 300 nm, preferably not exceeding 200 nm.

In still another aspect, a capacitor laminate defines a capacitance area and a capacitor-footprint area, and the capacitance area exceeds the capacitor-footprint area. Typically, the capacitance area is at least two times greater than the capacitor-footprint area. Preferably, the capacitance area is at least three times greater than the capacitor-footprint area, and more preferably, it is at least four times greater than the capacitor-footprint area. In some embodiments, the capacitor-footprint area does not exceed 0.5 nm$^2$. In other embodiments, the capacitor-footprint area does not exceed 0.2 nm$^2$.

In another aspect, a ferroelectric integrated circuit memory in accordance with the invention comprises a plurality of capacitor laminates.

In another aspect, the bottom electrode, the ferroelectric film, and the top electrode conform substantially to a 3-D shape.

Some embodiments further comprise a nonconductive hydrogen barrier layer disposed above the capacitor laminate, the nonconductive hydrogen barrier layer comprising strontium tantalate.

In embodiments in accordance with the invention, a capacitor laminate can have virtually any 3-D shape that provides a substantially greater effective capacitor surface area, or capacitance area, than its capacitor-footprint area. For example, some embodiments are characterized by a trench-shaped capacitor laminate. Accordingly, the ferroelectric integrated circuit memory preferably comprises an insulator layer having an insulator top surface, and a trench located substantially in the insulator layer, the trench having a trench bottom, a trench sidewall, and a trench opening substantially coplanar with the insulator top surface. A bottom electrode substantially conforms to the trench bottom and the trench sidewall. A ferroelectric film is disposed above the bottom electrode layer and conforms substantially to the bottom electrode. A top electrode is disposed above the ferroelectric film and substantially conforms to the ferroelectric film. In one aspect, the trench opening has a trench opening area and the top laminate surface has a laminate area, the laminate area being greater than the trench opening area. Typically, the laminate area is more than two times greater than the trench opening area. Preferably, the trench opening area does not exceed 0.5 nm$^2$, and more preferably it does not exceed 0.2 nm$^2$. In another aspect, a ferroelectric integrated circuit memory in accordance with the invention comprises a plurality of trenches and a plurality of corresponding capacitor laminates. In preferred embodiments, a distance between two adjacent trenches does not exceed 250 nm.

In some embodiments, a ferroelectric integrated circuit memory comprises a capacitor laminate having a 3-D pillar shape. A corresponding integrated circuit preferably comprises an insulator layer having a pillar of insulating material, the pillar having a pillar top: surface and a pillar sidewall. A bottom electrode covers a portion of the pillar, the bottom electrode substantially conforming to the pillar top surface and to a portion of the pillar sidewall. A ferroelectric film is disposed above the bottom electrode layer, the ferroelectric film substantially conforming to the bottom electrode. A top electrode is disposed above the ferroelectric film, the top electrode substantially conforming to the ferroelectric film. Characteristically, the bottom electrode, the ferroelectric film, and the top electrode are each part of a 3-D capacitor laminate, the 3-D capacitor laminate has a laminate thickness and a top laminate surface, and the pillar sidewall defines a pillar height, and the laminate thickness is less than the pillar height. In another aspect, the pillar top surface has a pillar top area and the top laminate surface has a laminate area, the laminate area being greater than the pillar top area. Typically, the laminate area is more than two times greater than the pillar top area. Typically, the pillar top area does not exceed 0.5 nm$^2$, and more preferably it does not exceed 0.2 nm$^2$. In still another aspect, a ferroelectric integrated circuit memory comprises a plurality of pillars and a plurality of corresponding capacitor laminates. Typically, a distance between two adjacent pillars does not exceed 250 nm.

A preferred method of forming a ferroelectric memory in an integrated circuit substrate in accordance with the invention comprises providing an integrated circuit portion having a 3-D bottom electrode. The method further comprises depositing a conformal ferroelectric thin film layer conforming to the bottom electrode layer using an MOCVD technique, and then depositing a conformal top electrode layer conforming to the ferroelectric thin film layer. Preferably, the integrated circuit substrate includes a switch and an insulator layer above the switch, wherein a portion of the insulator layer comprises a 3-D insulator surface, and the bottom electrode is formed conformal to said insulator surface. Typically, the method preferably further comprises processes of removing a portion of the top electrode layer, a portion of the ferroelectric thin film layer, and a portion of the bottom electrode layer to form a 3-D capacitor laminate including a top electrode, a ferroelectric film, and a bottom electrode. Preferably, depositing a conformal ferroelectric thin film layer comprises depositing a ferroelectric thin film layer having a thickness not exceeding 80 nm, and more preferably not exceeding 60 mL Preferably, depositing a conformal ferroelectric thin film layer is conducted using a low-thermal-budget MOCVD technique. In one aspect, using an MOCVD technique typically comprises flowing a metal organic precursor into an MOCVD reaction chamber containing the integrated circuit substrate to form a coating on the conformal bottom electrode layer, wherein the precursor contains metal atoms in effective amounts for forming the ferroelectric thin film layer, and heating the substrate including the coating using rapid thermal processing at a temperature in a range of about from 500° C. to 900° C. for a cumulative heating time not exceeding 30 minutes, and preferably less than five minutes. Typically, a method in accordance with the invention is further characterized by not heating the substrate in a furnace. Typically, heating the substrate comprises conducting a pre-TE RTP-treatment of the substrate including the coating before depositing the top electrode layer, and conducting a post-TE RTP-treatment after depositing the top electrode layer. Typically, a method further comprises processes of removing a portion of the top electrode layer, a portion of the ferroelectric thin film layer, and a portion of the bottom electrode layer to form a 3-D capacitor laminate including a top electrode, a ferroelectric film, and a bottom electrode before conducting the post-TE RTP-treatment. In some embodiments, a post-TE RTP-treatment is conducted in a nonreactive gas. Preferably, the MOCVD ferroelectric thin film is formed of a layered superlattice material.

The invention also provides a ferroelectric integrated circuit memory comprising: a 3-D capacitor laminate, the capacitor laminate comprising a bottom electrode, a ferroelectric film comprising a layered superlattice material, and a top electrode; wherein the 3-D capacitor laminate comprises a 3-D shape having substantial directional components in three mutually orthogonal planes. Preferably, the layered superlattice material comprises a material selected from the group consisting of strontium bismuth tantalate, strontium bismuth tantalum niobate, and bismuth lanthanum titanate.

The invention further provides a ferroelectric integrated circuit memory comprising: a 3-dimensional ("3-D") capacitor laminate, the capacitor laminate comprising a bottom electrode, a ferroelectric film, and a top electrode; wherein the 3-D capacitor laminate comprises a 3-D shape having substantial directional components in three mutually orthogonal planes; and wherein the capacitor laminate has a thickness not exceeding 300 nm. Preferably, the capacitor laminate has a thickness not exceeding 200 nm. Preferably, the laminate defines a capacitance area and a capacitor-footprint area, and the capacitance area exceeds the capacitor-footprint area. Preferably, the capacitance area is at least two times greater than the capacitor-footprint area. More preferably, the capacitance area is at least three times greater than the capacitor-footprint area. Most preferably, the capacitance area is at least four times greater than the capacitor-footprint area. Preferably, the capacitor-footprint area does not exceed 0.5 nm$^2$. More preferably, the capacitor-footprint area does not exceed 0.2 nm$^2$. Preferably, the ferroelectric film has a thickness not exceeding 80 nm. More preferably, the ferroelectric film has a thickness not exceeding 60 nm.

Numerous other features, objects and advantages of the invention will become apparent from the following description when read in conjunction with the accompanying drawings.

DETAILED DESCRIPTION OF THE INVENTION

Embodiments in accordance with the invention are described herein with reference to FIGS. 2-11B. It should be understood that FIGS. 2, 2A, 3, and 5A through 11B, depicting integrated circuit devices, are not meant to be actual plan or cross-sectional views of any particular portion of an actual integrated circuit device. In the actual devices, the layers will not be as regular and the thickness may have different proportions. The various layers in actual devices often are curved and possess overlapping edges. The figures instead show idealized representations which are employed to explain more clearly and fully the method of the invention than would otherwise be possible. Also, the figures represent only one of innumerable variations of ferroelectric devices that could be fabricated using the method of the invention.

Figure 2:
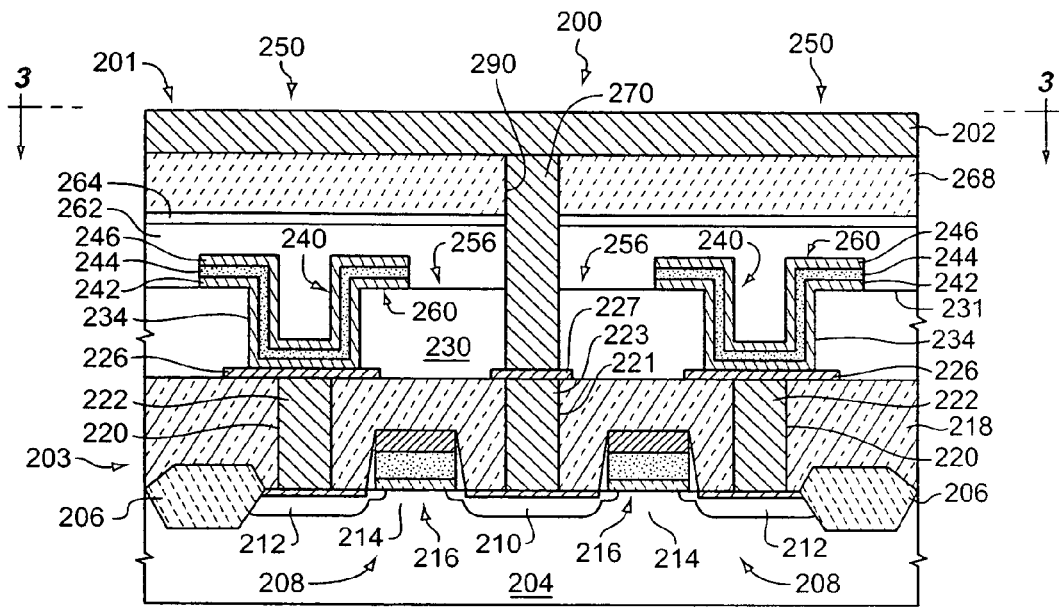
FIGS. 2 and 2A depict mutually orthogonal sectional views of a ferroelectric memory cell in accordance with the invention, in which active elements of a ferroelectric memory capacitor have a 3-D trench-shape including directional components substantially perpendicular to the underlying semiconductor substrate.
Figure 2A:
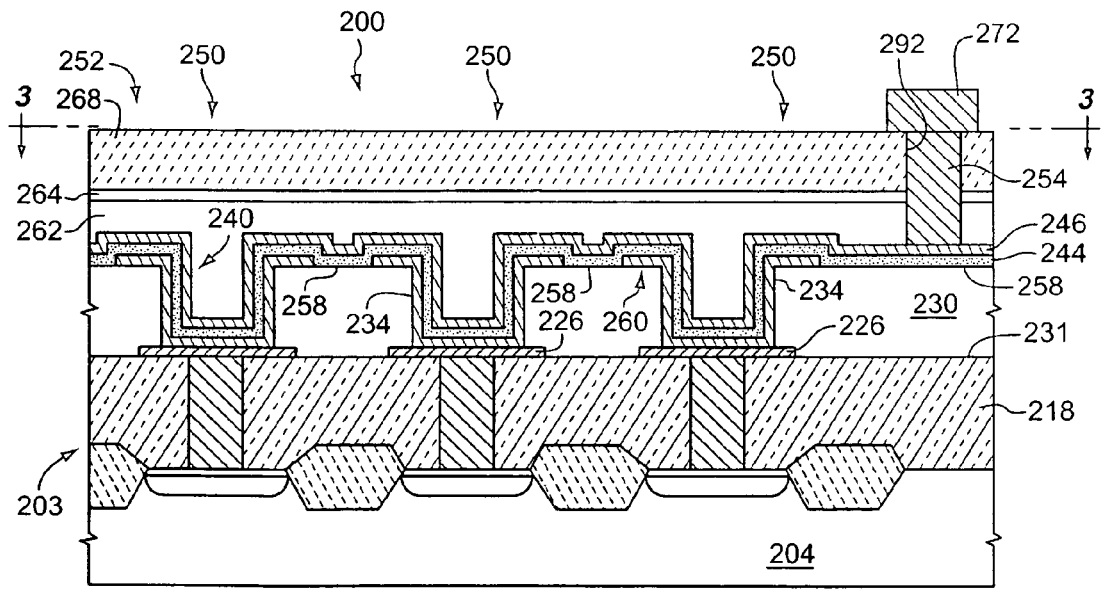
Figure 5:
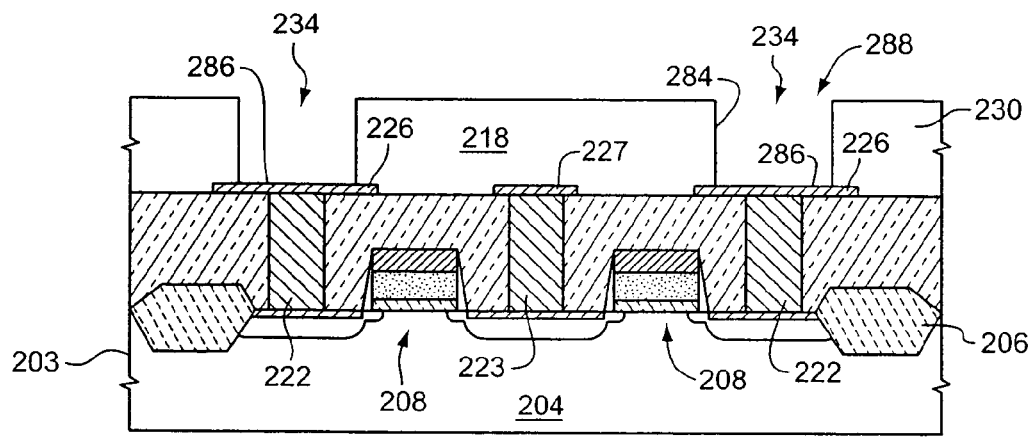
FIGS. 5 and 5A depict mutually orthogonal sectional views of an intermediate fabrication stage of a ferroelectric memory cell in accordance with the invention on the substrate of FIGS. 2, 2A.
Figure 5A:
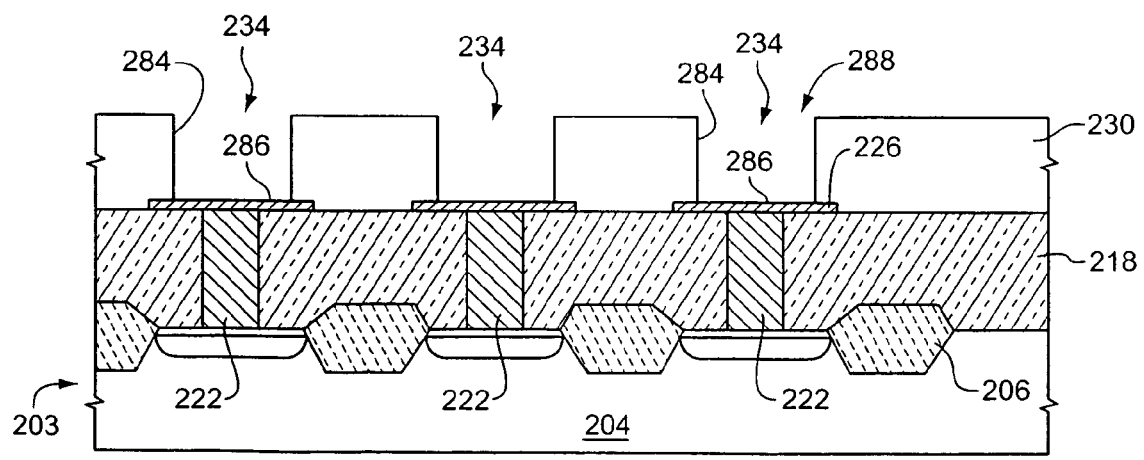

It also should be noted that the figures that are paired as a figure identified with a number above another figure with the same number followed by the letter "A" are mutually orthogonal cross sections of the same integrated circuit wafer. That is, FIGS. 2 and 2A are mutually orthogonal cross-sectional views of the same wafer, FIGS. 5 and 5A are mutually orthogonal cross-sectional views of the same wafer, and so on.

Embodiments in accordance with the invention are described herein mainly with reference to ferroelectric integrated circuit memories, and in particular, to memory capacitors containing a conformal thin film of ferroelectric layered superlattice material fabricated using an MOCVD technique. It is understood, however, that structures and methods in accordance with the invention are useful for making and using memory capacitors that include a nonferroelectric dielectric thin film instead of a ferroelectric thin film, or that contain a ferroelectric thin film comprising a material that is not a layered superlattice material General manufacturing processes for fabricating integrated circuits containing MOSFETs and ferroelectric capacitor elements are described in U.S. Pat. No. 5,466,629 issued Nov. 14, 1995 to Mihara et al., and U.S. Pat. No. 5,468,684 issued Nov. 21, 1995 to Yoshimori et al., which are hereby incorporated by reference as if fully disclosed herein. General fabrication methods have been described in other references also.

The preferred ferroelectric materials utilized in the invention comprise layered superlattice materials as described in U.S. Pat. No. 5,519,234 issued May 21, 1996 to Paz de Araujo et al., which is hereby incorporated herein by reference. Strontium bismuth tantalate is an example of a layered superlattice material. U.S. Pat. No. 5,434,102 issued Jul. 18, 1995, to Watanabe et al., and U.S. Pat. No. 5,468,684 issued Nov. 21, 1995, to Yoshimori et al., also both hereby incorporated by reference as though fully disclosed herein, describe processes for integrating these materials into practical integrated circuits. The layered superlattice materials may be summarized generally under the formula:

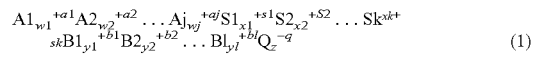

$$A1_{w1}^{+a1}A2_{w2}^{+a2}\ldots Aj_{wj}^{+aj}S1_{x1}^{+s1}S2_{x2}^{+s2}\ldots Sk_{xk}^{+sk}B1_{y1}^{+b1}B2_{y2}^{+b2}\ldots Bl_{yl}^{+bl}Q_z^{-q} \quad (1)$$

where A1, A2 . . . Aj represent A-site elements in the perovskite-like structure, which may be elements such as strontium, calcium, barium, bismuth, lead, and others; S1, S2 . . . Sk represent superlattice generator elements, which usually is bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine, and hybrids of these elements, such as the oxyfluorides, the oxychlorides, etc. The superscripts in formula (1) indicate the valences of the respective elements; for example, if Q is oxygen, then q=2. The subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary uniformly throughout the material; for example, in $SrBi_2(Ta_{0.75}Nb_{0.25})_2O_9$, 75% of the B-sites are occupied by tantalum atoms, and 25% of the B-sites are occupied by niobium atoms. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although formula (1) is written in the more general form since the invention is intended to include cases where either of the sites and the superlattice generator can have multiple elements. The value of z is found from the equation:

$$(a1w1+a2w2\ldots+ajwj)+(s1x1+s2x2\ldots+skxk)+(b1y1+b2y2\ldots+blyl)=qz. \quad (2)$$

Formula (1) includes all three of the Smolenskii type compounds discussed in U.S. Pat. No. 5,519,234 referenced above. The layered superlattice materials do not include every material that can be fit into Formula (1), but only those which form crystaline structures with distinct alternating layers.

U.S. Pat. No. 5,803,961 issued Sep. 8, 1998 to Azuma et al., which is hereby incorporated herein by reference as though fully disclosed herein, discloses that mixed layered superlattice materials, such as strontium bismuth tantalum niobate, have improved properties in ferroelectric applications. The mixed layered superlattice materials are characterized by nonstoichiometric amounts of A-site and B-site elements. For example, a preferred precursor used in accordance with the invention comprises metal organic precursor compounds having metals in relative molar proportions corresponding to the stoichiometrically unbalanced formula $Sr_{0.8}Bi_2(Ta_{0.7}Nb_{0.3})_2O_{8.8}$.

Currently, ferroelectric layered superlattice materials, like the metal oxides $SrBi_2Ta_2O_9$ (SBT), $SrBi_2(Ta_{1-x}Nb_x)_2O_9$ (SBTN), where $0 \leq x \leq 1$, and particularly $Sr_aBi_b(Ta_{1-x}Nb_x)_cO_{[9+(a-1)+(b-2)(1.5)+(c-2)(2.5)]}$, where $0.8 \leq a \leq 1$, $2 \leq b \leq 2.2$, $0 \leq x \leq 0.3$ and $1.9 \leq c \leq 2.1$ (SBTN), are being used and are under further development for use as capacitor dielectric in nonvolatile memory applications, such as in FeRAMs and nondestructible read-out ferroelectric FETs. Polycrystalline thin films of these layered superlattice materials, as well as other layered superlattice materials represented by Formula (1), may be fabricated and used in accordance with the invention. Other layered superlattice materials that are particularly useful in the invention include bismuth lanthanum titanate, sometimes referred to as BLT.

The word "substrate" can mean the underlying semiconductor material 204 on which the integrated circuit is formed, as well as any object on which a thin film layer is deposited. In this disclosure, "substrate" shall generally mean the entire workpiece as it exists at a particular phase of fabrication and on which a particular fabrication process is being conducted.

The long dimensions of integrated circuit substrate 203, 503 and semiconductor material 204, 504 in FIGS. 2, 2A and FIGS. 9A, 9B, respectively, and in related figures, are considered to be a "horizontal" plane herein, and directions perpendicular to this plane are considered to be "vertical". Terms of orientation herein, such as "above", "top", "upper", "below", "bottom", and "lower", mean relative to semiconductor material 204, 504. That is, if a second element is "above" a first element, it means it is farther from semiconductor material 204, 504; and if it is "below" another element, then it is closer to semiconductor material 204, 504 than the other element. Terms such as "above", "below", and "on" do not, by themselves, signify direct contact, although a layer that is above, below, or on another layer can also be in direct contact with the layer. However, terms such as "directly on" or "onto" do signify direct contact of one layer with an underlying layer. It is understood that thin films of layered superlattice material fabricated in accordance with the invention have various shapes and conform to various topographies and features of an integrated circuit substrate. Accordingly, thin films of layered superlattice material in accordance with the invention are formed on planar substrates, in trenches and vias, on vertical sidewalls, and in other various non-horizontal and three-dimensional shapes. As depicted in FIGS. 2, 2A and FIGS. 9, 9B, a layer of memory cells comprising switches and capacitors is formed on semiconductor material 204, 504 of an integrated circuit substrate 203, 503. It is understood that embodiments in accordance with the invention also provide a plurality of layers of memory cells formed sequentially one on top of the other on a single integrated circuit substrate.

The terms "three mutually orthogonal planes", "three orthogonal directions", and similar terms are used synonymously to describe a shape of an element or a combination of elements in structures in accordance with the invention. The terms signify that a shape has directional components in three mutually orthogonal planes, for example, in the x, y, and z planes of a Cartesian coordinate system.

The term "capacitance area" and similar terms refer to the effective surface area of a capacitor that determines capacitance. Typically, the capacitance area of a capacitor is determined by the smallest surface area of the top electrode, the capacitor dielectric, and the bottom electrode.

The term "conformal", when applied to an integrated circuit element, means that the element follows the contour of the underlying layer. Preferably, the conformal layers in this disclosure are also smooth, continuous, and uniform.

The term "thin film" is used herein as it is used in the integrated circuit art. Generally, it means a film of less than a micron in thickness. The thin films disclosed herein are usually less than 500 nanometers (nm) in thickness, and more typically in a range of about from 5 nm to 200 nm. For example, a thin film of layered superlattice material fabricated in an integrated circuit in accordance with the invention typically has a final thickness in a range of from 25 nm to 150 nm. The "thickness" of a 3-D electrode, a 3-D ferroelectric thin film, or a 3-D capacitor laminate in accordance with the invention refers to the thickness as would be measured perpendicular to a tangent line at the surface of the thin film at any given point. These thin films of the integrated circuit art should not be confused with the layered capacitors of the macroscopic capacitor art which are formed by a wholly different process that is incompatible with the integrated circuit art. The term "MOCVD ferroelectric film" and similar terms refer to a ferroelectric thin film fabricated using a MOCVD technique, preferably using a low-thermal-budget MOCVD technique as disclosed in U.S. patent application Ser. No. 10/302,441 filed Nov. 22, 2002, which is incorporated by reference.

The term "stoichiometric" herein may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2(TaNb)O_9$ and $SrBi_2(Ta_{1.5}Nb_{0.5})O_9$ are balanced stoichiometric formulae. In contrast, a precursor for strontium bismuth tantalum niobate in which the molar proportions of strontium, bismuth, tantalum, and niobium are 0.9, 2.18, 1.5, and 0.5, respectively, is represented herein by the unbalanced "stoichiometric" formula $Sr_{0.9}Bi_{2.18}(Ta_{1.5}Nb_{0.5})O_9$, since it contains excess bismuth and deficient strontium relative to the B-site elements tantalum and niobium. It is common in the art to write an unbalanced stoichiometric formula of a metal oxide in which the subscript of the oxygen symbol is not corrected to balance completely the subscript values of the metals.

The word "precursor" used herein can mean a solution containing one metal organic solute that is mixed with other precursors to form intermediate precursors or final precursors, or it may refer to a final liquid precursor solution or gas mixture, that is, the precursor to be applied to a particular surface during fabrication. The precursor as applied to the substrate is usually referred to as the "final precursor", "precursor mixture", or simply "precursor". In any case, the meaning is clear from the context.

A "precursor compound" in this disclosure refers to a metal organic compound containing at least one metal that is included in a desired layered superlattice material of the ferroelectric thin film formed in accordance with the invention. The metal organic precursor compounds disclosed herein are useful because they can be easily dissolved in organic liquid precursor solutions, which can be stored until used. In a liquid-source misted chemical deposition ("LSMCD") method in accordance with the invention, one or more liquid precursor solutions are atomized to form a mist that contains precursor compounds suitable for formation of a desired conformal thin film. See, for example, U.S. Pat. No. 6,326,315 B1 issued Dec. 4, 2001 to Uchiyama et al., and U.S. Pat. No. 6,258,733 B1 issued Jul. 10, 2001 to Solayappan et al., which are hereby incorporated by reference. In embodiments in accordance with the invention utilizing an MOCVD technique to deposit a coating with desired stoichiometry on a substrate, typically one or more liquid precursor streams are vaporized, and then one or more gaseous precursor compounds flow into a CVD reaction chamber, in which a solid coating containing desired metal compounds forms on a wafer substrate. See, for example, U.S. Pat. No. 6,110,531 issued Aug. 29, 2000 to Paz de Araujo et al., which is hereby incorporated by reference. The composition of a precursor solution may be described in two ways. The actual dissolved metal organic precursor compounds (solutes) and solvents and concentrations may be specified; or, for the sake of clarity, the stoichiometric formula representing the composition of the final oxide compound to be formed with the precursor may be specified. Similarly, a precursor compound may be described using its name or stoichiometric formula, or it may simply be identified by the metal atoms it contains.

Metal organic precursor compounds and liquid precursor solutions used in accordance with the invention can be manufactured reliably. Their composition can be easily controlled and varied, if necessary. They can be safely stored for long periods, up to six months. They are relatively nontoxic and nonvolatile, compared with many precursors of the prior art.

In one aspect, a method having a low thermal budget in accordance with the invention generally minimizes the cumulative heating time that an integrated circuit substrate is heated above 550° C. especially, it minimizes the thermal budget of operations conducted above 700° C. The terms "cumulative heating time", "total heating time", and related terms in the specification designate the time during fabrication steps that an integrated circuit substrate is heated at a temperature of 500° C. or greater after an initial precursor coating is deposited on the substrate. During fabrication of an integrated circuit memory containing a capacitor comprising metal oxide dielectric material, in particular, ferroelectric layered superlattice material, the cumulative heating time refers particularly to the total duration of substrate heating above 500° C. from the point of starting to deposit an initial precursor coating on the substrate to the point of forming metallization and wiring layers on the completed memory cell. In the prior art, when a substrate including a ferroelectric coating was heated by RTP and furnace at a temperature of 650° C. for 30 minutes before forming a top electrode, and thereafter heated again in a furnace at 700° C. for 60 minutes after formation of a top electrode, then the cumulative heating time was 90 minutes. In contrast, representative exemplary cumulative heating times in low-thermal-budget MOCVD methods in accordance with the invention are about two to three minutes or less.

The term "thermal budget" is also used herein in reference to a product of (elevated processing temperature) multiplied by (time at elevated processing temperature). It has been observed that damage to an integrated circuit resulting from heating at a given temperature decreases by reducing the duration of heating at that temperature. Further, it has been observed that damage to the integrated circuit further decreases by utilizing RTP heating. Damage from heating an integrated circuit also decreases by heating at an increased temperature for a shorter amount of time. For example, generally less thermal damage occurs by heating at 800° C. for 5 seconds, than by heating at 700° C. for 10 minutes. Therefore, in selecting operating conditions in methods in accordance with the invention, a reduced heating time at a higher temperature is preferable to a longer heating time at a lower temperature. Heating of an integrated circuit substrate to achieve good crystallization of layered superlattice materials (or other metal oxide) and to minimize thermal damage to the integrated circuit is influenced by a number of variables, including, but not limited to: heating temperature; total heating time at elevated temperature (e.g., 800° C.); thin film thickness; presence of oxygen; and relative location of diffusion barrier layers. For example, a thin film of layered superlattice material having a thickness less than 100 nanometers (nm) generally requires a lower thermal budget to achieve good electronic properties than a thicker film. In the field of reaction engineering, it is known that the reaction rate is generally proportional to temperature; that is, the reaction rate increases with temperature. Nevertheless, the proportional relationship of reaction rate to temperature is usually not linear. In the art, it is generally held that reaction rate approximately doubles when temperature increases 10° C. Thus, by increasing the temperature of a chemical reaction process by 30° C., for example, the time required for reaction is reduced to a fraction of the time required without temperature increase. Efforts in the prior-art to reduce thermal damage to integrated circuit memory capacitors typically aimed to minimize the temperature levels at which a memory circuit was heated. In contrast, methods in accordance with the present invention are designed to minimize the thermal budget of a process, that is, the product of heating time and heating temperature. Because the relation between reaction temperature and reaction rate is not linear, the heating time, and thereby the thermal budget of a process, are reduced by a relatively large amount through a relatively small increase in heating temperature. As a result, certain embodiments in accordance with the invention conduct heating of an integrated circuit memory substrate at temperatures higher than reported in the prior art, but during a much-reduced heating time.

The term "strontium tantalate" (or "strontium tantalum oxide") herein means any one or several of the oxide compounds comprising strontium and tantalum. Strontium tantalate in accordance with the invention is represented herein by the generalized stoichiometric formula $SrTaO_x$, which represents strontium tantalate compounds including, but not limited to, $SrTa_2O_6$ and $Sr_2Ta_2O_7$.

The terms "region" and "area" as used herein generally have their usual meaning; that is, "area" generally designates a two-dimensional surface, whereas a "region" is generally three-dimensional. For example, a "non-memory area" of a layer or a substrate in this specification generally corresponds to a "non-memory region" of an integrated circuit located below or above a non-memory area The terms "dielectric thin film", "capacitor dielectric", and similar terms referring to a thin film of dielectric material between electrodes in a capacitor are used broadly to include not only the purely insulating dielectric materials, but also ferroelectric materials that are both dielectric and ferroelectric, such as certain $ABO_3$-type oxides and, in particular, ferroelectric layered superlattice materials.

The term "continuous" and similar terms used to describe a plate-line electrode or a diffusion barrier layer means substantially unbroken or uninterrupted.

Integrated circuit memory capacitors often include one or more layers in addition to a top electrode, a capacitor ferroelectric or dielectric thin film, and bottom electrode. Such additional layers have various names, such as "buffer layer", "adhesive layer", "capping layer", and others. As disclosed variously in the art, such an additional layer may be disposed between a ferroelectric or dielectric thin film and an adjacent electrode, or it may be disposed adjacent to an outside surface of an electrode. Also, such additional layers may be referred to as part of the ferroelectric or dielectric thin film, or as part of an electrode. Therefore, in this specification, it is understood that a top electrode, a ferroelectric or dielectric thin film, or a bottom electrode in accordance with the invention may include an additional layer as known in the art, without specific reference to such an additional layer. Similarly, a method in accordance with the invention may further include formation of such an additional layer.

FIGS. 2, 2A depict mutually orthogonal cross-sectional views of an exemplary nonvolatile ferroelectric memory of integrated circuit 200 in accordance with the invention. FIG. 2 shows a cross-section 201 taken along the bit line 202 of integrated circuit 200. Integrated circuit memory 200 includes silicon semiconductor material 204, field oxide regions 206, and switches 208. A switch 208 is typically a metal-oxide semiconductor field-effect transistor ("MOSFET"), formed using techniques known in the art. A MOSFET switch 208 includes source/drain regions 210, 212, a channel region 214, and a gate 216, typically comprising a gate buffer layer, gate insulating layer, and gate electrode. Integrated circuit memory 200 further includes a first insulator layer 218, typically called an interlayer dielectric layer ("ILD"), disposed on substrate 203, and covering semiconductor material 204, oxide regions 206, and switches 208. First insulator layer 218 typically comprises nondoped silicate glass ("NSG") or a doped glass, such as BPSG (boron-doped phospho-silicate glass) and is typically formed using a CVD technique as known in the art. In other embodiments in accordance with the invention, integrated circuit material 204 comprises silicon germanium, gallium arsenide or other semiconductor, or an insulator such as magnesium oxide (MgO). Substrate 203 further includes vias 220, 221 in which conductive capacitor plugs 222 and conductive bit-line plug 223, respectively, are disposed. Electrically conductive plugs 222, 223 typically are formed by filling vias 220, 221 with electrically conductive material and planarizing the surface of substrate 203 so that the tops of plugs 222, 223 are approximately coplanar with first insulator layer 218, as depicted in FIG. 2. Plugs 222, 223 are formed so that the bottom of each plug is in electrical contact with switch 208. Preferably, conductive plugs 222, 223 comprise tungsten, which is deposited using techniques known in the art. In more preferred embodiments, plugs 222, 223 are formed by depositing a layer of titanium having a thickness in a range of about from 5 nm to 30 nm in vias 220, 221, followed by depositing a layer of titanium nitride having a thickness in a range of about from 5 nm to 30 nm on the titanium, followed by deposition of tungsten.

Electrically conductive diffusion barrier material is deposited and patterned on ILD 218 to form diffusion barriers 226, 227 in electrical contact with plugs 222, 223, respectively. Diffusion barriers 226, 227 are made of, for example, titanium nitride, and typically have a thickness of 10 nm to 20 nm. Diffusion barrier layers, such as titanium nitride, inhibit the diffusion of chemical species, particularly oxygen, between the underlying and overlying layers of integrated circuit memory 200.

A second interlayer dielectric layer (ILD) 230 made of NSG (nondoped silicate glass) is disposed on ILD 218 to cover ILD 218 and diffusion barriers 226, 227. A doped silicate glass, such as FSG (fluorosilicate glass), PSG (phospho-silicate glass) film, or a BPSG (boron phospho-silicate glass) film could also be used in layer 230. ILD 230 has a top surface 231. ILD 230 is patterned and etched to form trenches 234.

Figure 1:
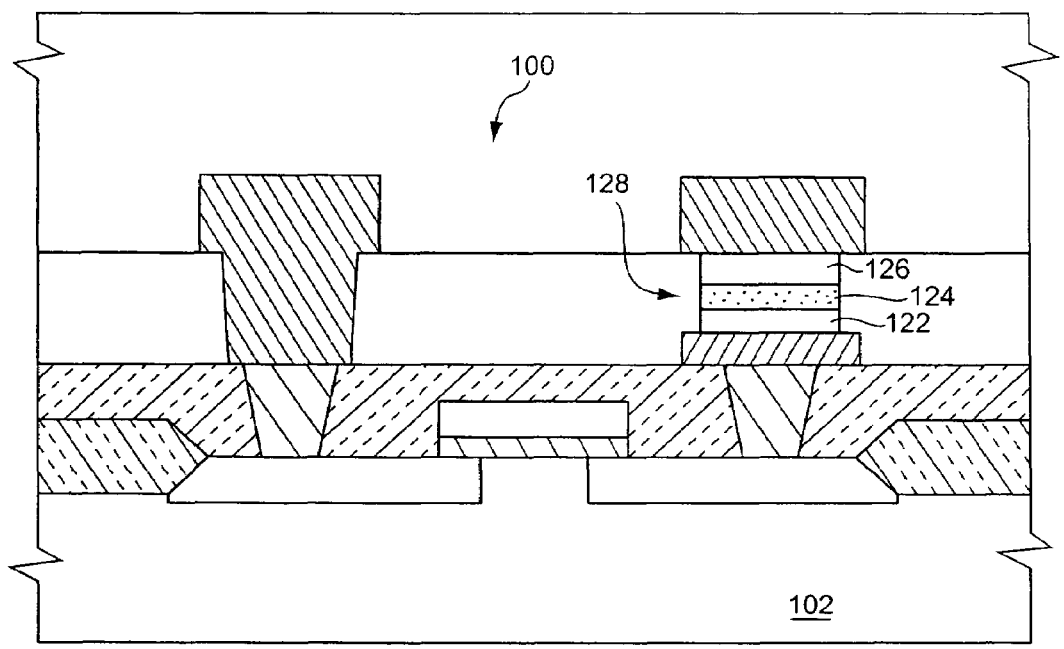
FIG. 1 depicts in schematic form a section of a ferroelectric memory cell of the prior art, in which the active elements of a memory capacitor are substantially parallel to the underlying semiconductor substrate.

In accordance with the invention, each trench 234 is lined with a 3-D capacitor laminate 240. A capacitor laminate 240 comprises a bottom electrode 242, a ferroelectric thin film 244, and a top electrode 246. Trench 234 is three-dimensional; that is, the shape of trench 234 has substantial vertical components, or substantial directional components substantially perpendicular to the horizontal plane of semiconductor substrate 204. As a result, capacitor laminate 240, which conforms substantially to the shape of trench 234, also has a 3-D shape. In preferred embodiments, top electrode 246 is a top plate-line electrode that extends substantially perpendicular to bit line 202 of FIG. 2. Capacitor laminate 240 in each trench 234 functions as a ferroelectric memory capacitor 250 in integrated circuit 200. FIG. 2A depicts a cross-section 252 taken along a top plate-line electrode 246 of integrated circuit 200. Top plate-line electrode 246 is not planar, rather, it is a plate line in the sense that it extends continuously between a plurality of memory capacitors 250 and provides continuous electrical connection between the capacitors and a conductive plate-line connector plug 254. As depicted in FIG. 2, capacitor laminate 240 is not present on a non-capacitor area 256 of top surface 231 of ILD 230 between adjacent capacitors 250 along bit line 202. Similarly, as depicted in FIG. 2A, bottom electrode 244 is not present on non-capacitor area 258 between adjacent capacitors 250 along top plate-line electrode 246. As depicted in FIGS. 2, 2A, an overlap portion 260 of laminate 240 of each capacitor 250 typically slightly overlaps top surface 231 of ILD 230. The footprint, or horizontal surface area, of a capacitor 250 is determined essentially by the horizontal area of trench 234 and the area of overlap portion 260. The capacitance area of capacitor 250, however, is represented approximately by the surface area of the bottom and sidewall of trench 234 plus the area of overlap portion 260. A trench 234 is typically patterned to have a square rectangular shape. In a square trench having a depth equal to the length of one of its sides, the surface area of its sidewall (all four square sides) is four times greater than the surface area of its bottom (or of its top). As a result, a capacitor 250 in accordance with the invention having a footprint only one-fourth the horizontal surface area of a conventional horizontally-oriented capacitor of the prior art provides approximately the same capacitance area. Similar relative proportions obtain when trenches have circular shapes. A capacitor 250 in accordance with the invention typically comprises a bottom electrode having a thickness of about 50 nm, a ferroelectric thin film having a thickness of about 50 nm to 60 nin, and a top electrode having a thickness of about 50 nm. Thus, a corresponding capacitor laminate 240 has a thickness of about 150 nm to 170 nm. A corresponding cube-shaped trench 234 in accordance with the invention has length, width, and depth dimensions of approximately 350 nm to 400 nm, that is, about 0.35 nm to 0.40 nm. A capacitor 250 in accordance with the invention typically has a footprint of approximately 0.2 nm$^2$. In contrast, a conventional memory capacitor of the prior art, as depicted in FIG. 1, typically has a footprint of about 0.8 nm$^2$ or more.

The bottom and top electrodes of ferroelectric capacitors conventionally contain platinum. It is preferable that the bottom electrode contains a non-oxidized precious metal such as platinum, palladium, silver, and gold. In addition to a precious metal, metal such as aluminum, aluminum alloy, aluminum silicon, aluminum nickel, nickel alloy, copper alloy, and aluminum copper may be used for electrodes of a ferroelectric memory. Adhesive layers (not shown), such as titanium, enhance the adhesion of the electrodes to adjacent underlying or overlying layers of the circuits.

A third interlayer dielectric layer (ILD) 262 made of NSG (nondoped silicate glass) is disposed on ILD 218 and top plate-line electrode 246, thereby covering ferroelectric 3-D memory capacitors 250. A doped silicate glass, such as FSG (fluorosilicate glass), PSG (phospho-silicate glass) film, or a BPSG (boron phospho-silicate glass) film may also be used in layer 262.

Hydrogen barrier layer 264 is disposed on ILD 262 to cover the surface area above ferroelectric thin film 244. The composition, fabrication, and etching of hydrogen barriers are known in the art. See, for example, U.S. Pat. No. 6,225,656 B1 issued May 1, 2001 to Cuchiaro et al., and U.S. Pat. No. 6,180,971 issued Jan. 30, 2001 to Maejima, which are hereby incorporated by reference. Preferably, hydrogen barrier layer 264 comprises strontium tantalum oxide, as disclosed in co-owned and co-pending U.S. patent application Ser. No. 09/998,469 filed Nov. 29, 2001. Typically, hydrogen barrier layer 264 is not present over non-memory areas of the integrated circuit where there is no ferroelectric thin film 244 needing protection against reactive hydrogen.

A fourth interlayer dielectric layer (ILD) 268 made of NSG (nondoped silicate glass) is disposed on ILD 262 and diffusion barrier layer 264. A doped silicate glass, such as FSG (fluorosilicate glass), PSG (phospho-silicate glass) film, or a BPSG (boron phospho-silicate glass) film could also be used in layer 268. As depicted in FIG. 2, electrically conductive bit-line connector plug 270 connects bit line 202 to switch 208 through conductive barrier 227 and bit-line plug 223. As depicted in FIG. 2A, electrically conductive plate-line connector plug 254 connects wiring layer 272 to top plate-line electrode 246.

Figure 3:
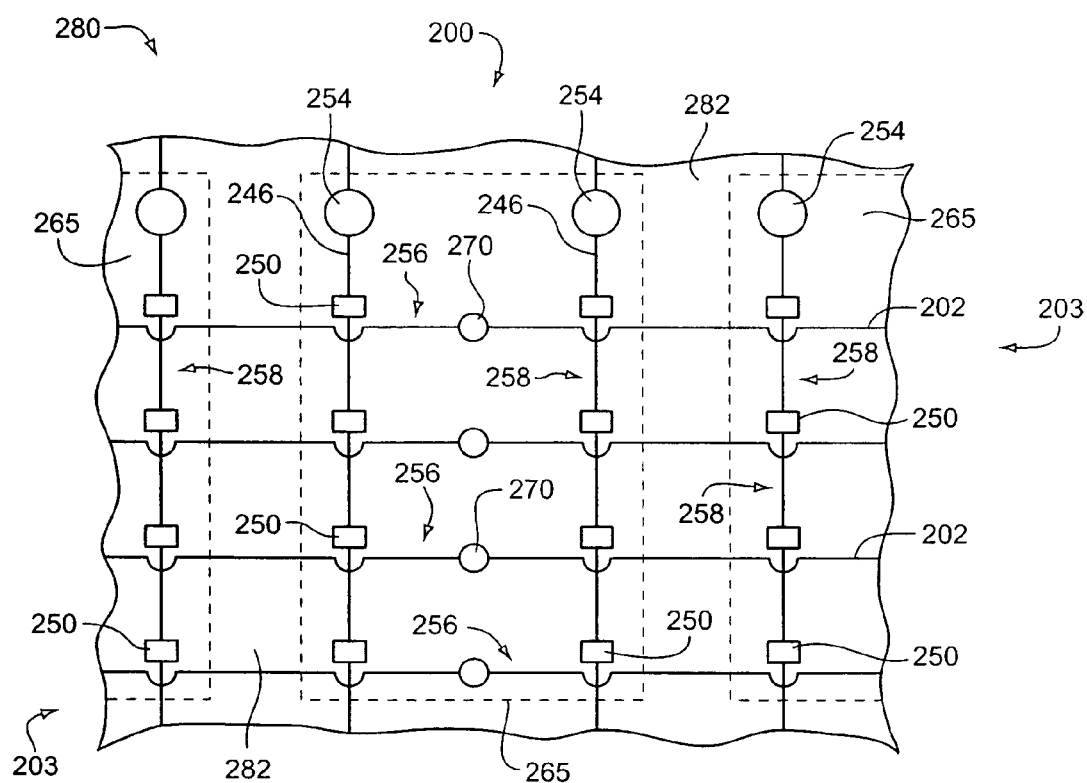
FIG. 3 depicts in schematic form a top view of a horizontal section of the substrate shown in FIGS. 2, 2A.

FIG. 3 depicts in schematic form a top view 280 of a section of integrated circuit substrate wafer 203 taken approximately through lines 3 of FIGS. 2 and 2A. In section 280, memory regions 265, indicated by dashed rectangles, comprise memory capacitors 250 and MOSFET switches 208 (not shown in FIG. 3). Although memory regions 265 are represented in FIG. 3 as having a rectangular shape, it is clear that memory regions 265 in actual integrated circuits have different shapes depending on the particular shapes, locations, and dimensions of capacitors 250 and switches 208. Hydrogen barrier layer 264, depicted in FIGS. 2, 2A, typically covers memory region 265. Non-memory regions of substrate 203 comprise non-memory regions 282 outside memory regions 265, as represented in FIG. 3. As indicated in FIGS. 2 and 3, a memory region 265 typically comprises at least a portion of conductive bit-line connector plugs 223, 270, which provide electrical contact between a switch 208 of a memory cell and a bit-line 202 of an integrated circuit. In preferred embodiments in accordance with the invention, as depicted in FIGS. 2A and 3, conductive plate-line connector plug 254 is disposed remotely from capacitors 250. It is a feature of certain preferred embodiments in accordance with the invention that a nonconductive buried diffusion barrier (not depicted) is disposed throughout an extended area, typically substantially the entire area of an integrated circuit, as disclosed in U.S. patent application Ser. No. 10/302,442 filed Nov. 22, 2002. In other words, buried diffusion barrier 226 is extended so it is disposed over the extended surface area of FIG. 3 and underlies substantially completely all of the integrated circuit elements depicted in FIG. 3. Capacitors 250 are represented by rectangles in FIG. 3. The rectangles 250 also correspond to the areas of capacitor laminates 240 of FIGS. 2, 2A, and therefore also represent the footprint of ferroelectric memory capacitors 250. As depicted in FIG. 3, capacitor laminate 240 is generally not present in non-capacitor areas 256 along bit lines 202. Bottom electrode material is not present in non-capacitor areas 258 along top plate-line 246.

Figure 4:
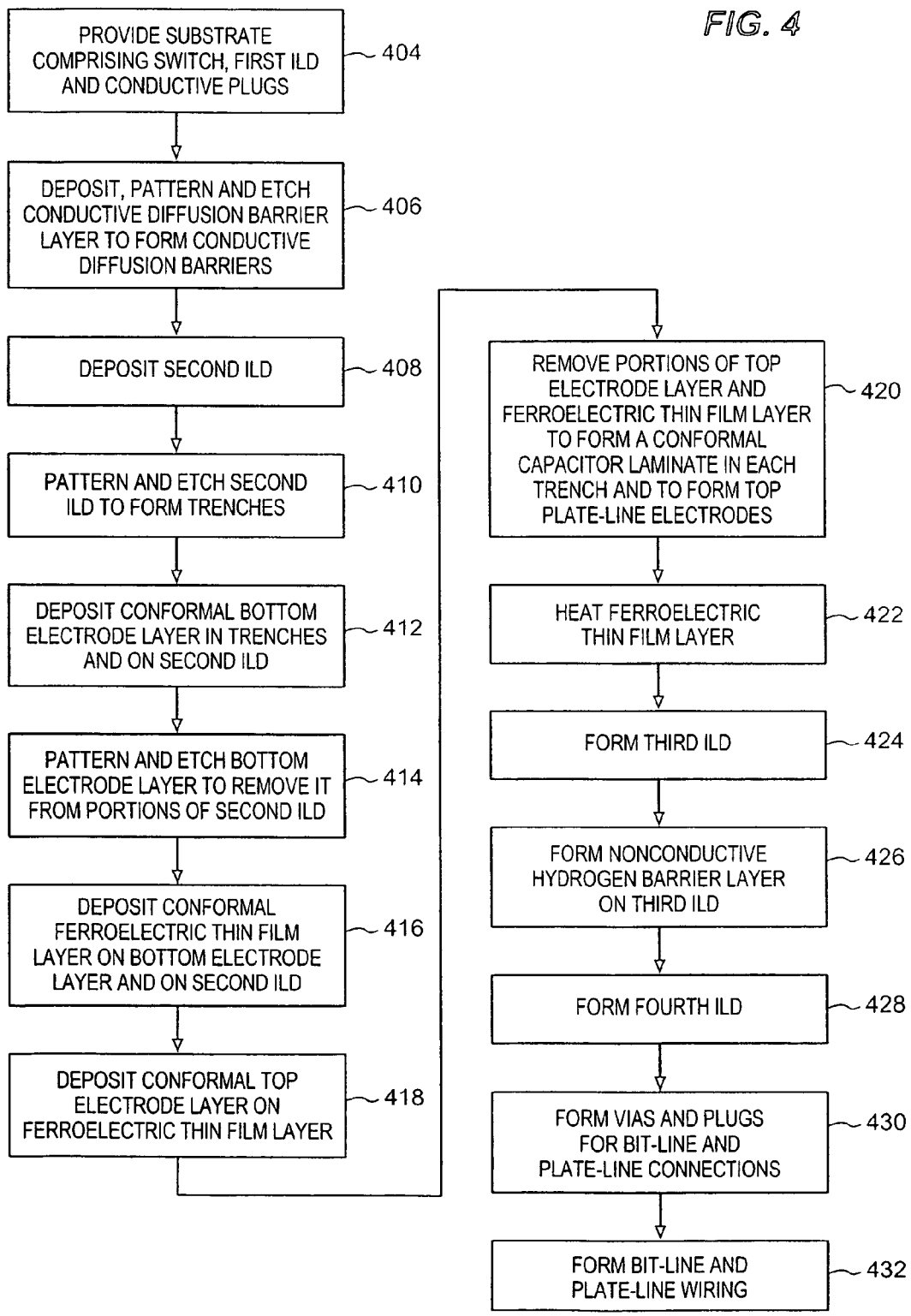
FIG. 4 contains a process flow sheet of a method for fabricating an integrated circuit having a 3-D ferroelectric memory capacitor in accordance with the invention as depicted in FIGS. 2, 2A.
Figure 6:
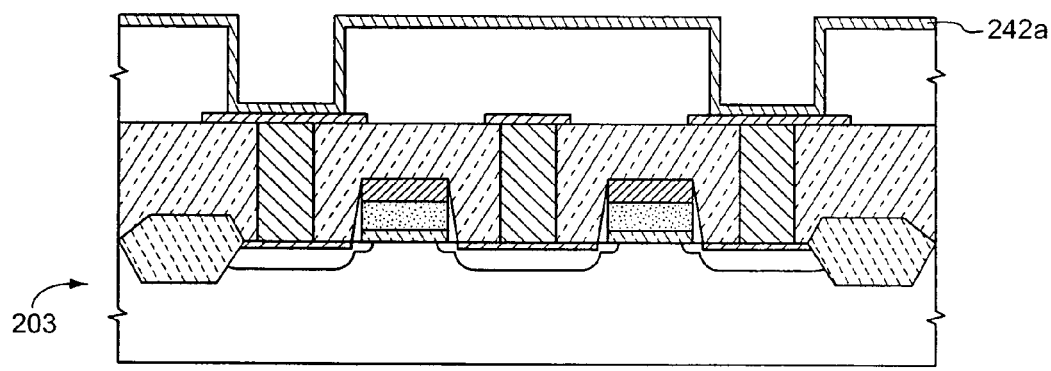
FIGS. 6 and 6A depict mutually orthogonal sectional views of the substrate of FIGS. 5, 5A in a further intermediate fabrication stage of a ferroelectric memory cell in accordance with the invention.
Figure 6A:
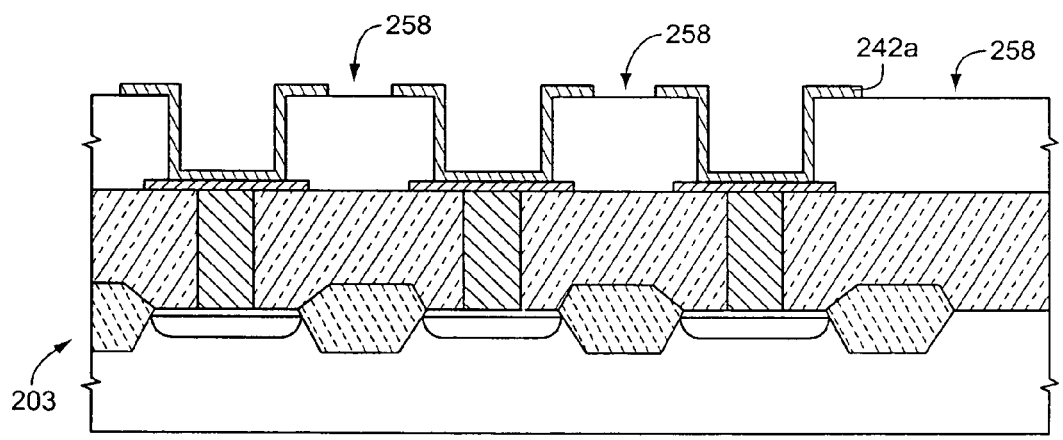

The diagram of FIG. 4 is a process flow sheet of a method 400 in accordance with the invention for making a preferred embodiment of a ferroelectric memory in accordance with the invention. This figure will be discussed in conjunction with FIGS. 5 and 5A, 6 and 6A, 7 and 7A, and 8 and 8A. In each case, the two figures are mutually orthogonal views of the same integrated circuit portion. That is, FIGS. 5 and 5A are mutually orthogonal views of the same integrated circuit portion, FIGS. 6 and 6A are mutually orthogonal views of the same integrated circuit portion, and so on. Although method 400 of FIG. 4 is discussed herein with reference to FIGS. 2 and 5-8A, representing a ferroelectric integrated circuit memory in successive stages of fabrication, it is clear that the method of FIG. 4 and numerous embodiments of a method in accordance with the invention are useful generally for fabricating a 3-D ferroelectric memory capacitor.

In processes 404, a substrate 203 is provided containing silicon semiconductor material 204, field oxide regions 206, switches 208, first ILD 218, and conductive plugs 222, 223, as described above with reference to FIG. 2 and as depicted in FIGS. 5, 5A. First insulator layer 218 typically comprises nondoped silicate glass ("NSG") or a doped glass, such as BPSG (boron-doped phospho-silicate glass), and is typically formed by reacting a precursor using a CVD technique as known in the art. In other embodiments in accordance with the invention, integrated circuit substrate 203 comprises gallium arsenide or other semiconductor, or an insulator such as magnesium oxide (MgO).

In processes 406, a conductive diffusion barrier layer is deposited and then patterned and etched to form conductive diffusion barriers 226, 227. An electrically conductive oxygen-diffusion barrier layer is deposited on substrate 203 to cover first insulator layer 218 and conductive plugs 222, 223. In preferred embodiments, the electrically conductive oxygen-diffusion barrier layer comprises a multilayer structure comprising an iridium oxide sublayer, which is on an iridium sublayer, which is on a titanium aluminum nitride sublayer, as represented by $IrO_x/Ir/TiAlN$. A preferred barrier stack is fabricated by first sputtering a sublayer of titanium aluminum nitride having a thickness of about 50 nm onto first ILD 218 and conductive plugs 222, 223, then sputtering about 100 nm iridium metal onto the nitride sublayer, and then sputtering about 100 nm of iridium oxide onto the iridium sublayer. Thereafter, the conductive barrier layer is patterned and etched to remove conductive barrier material from ILD 218, except for areas above conductive plugs 222, 223 and areas corresponding approximately to the footprints of capacitors 250.

In processes 408, second ILD 230 is formed on substrate 203, typically by depositing approximately 500 nm NSG or doped silicate glass by reacting TEOS or other known precursor using a PECVD technique known in the art.

In processes 410, portions of second ILD 230 are removed using patterning and etching techniques known in the art to form trenches 234. Trenches 234 each have a sidewall 284 and a trench bottom 286 defined at least partially by conductive barrier 226. A trench bottom 286 may also comprise insulator material associated with ILD 218 or ILD 230. Typically, patterning of ILD 230 is done in a rectangular or square shape so that trenches 234 have shapes corresponding substantially to squares or rectangles. It is understood, however, that trenches 234 may be patterned and etched to have virtually any shape, for example, a cylindrical shape. Furthermore, standard etching techniques usually form trenches having sidewalls that are not perfectly parallel to the direction of etching, that is, that are not perfectly perpendicular to the horizontal plane of semiconductor substrate 204. As a result, the top region 288 of a trench 234 is typically wider than a corresponding trench bottom 286. Nevertheless, a sidewall 284 and capacitor layers conforming to sidewall 284 have substantial directional components in the vertical direction, as well as in the horizontal planes at the bottom 286 and top 288, and are therefore three-dimensional In processes 412, a conformal bottom electrode layer 242a is deposited in trenches 234 and on second ILD 230, as depicted in FIG. 6. Preferably, the conformal bottom electrode layer has a thickness of about 50 nm and comprises platinum. Typically, a bottom electrode layer is formed by sputtering a platinum target using techniques known in the art. Preferably, the electrode is formed by RF sputtering of a platinum single layer, but it also may be formed by DC sputtering, ion beam sputtering, vacuum deposition, or other appropriate conventional deposition process. The bottom and top electrodes of memory capacitors in accordance with the invention preferably contain platinum. Nevertheless, in certain embodiments, a bottom electrode comprises another non-oxidized precious metal, such as palladium, silver, and gold. In addition to the precious metals, a metal such as aluminum, aluminum alloy, aluminum silicon, aluminum nickel, nickel alloy, copper alloy, and aluminum copper may be used to form electrodes of a memory capacitor in accordance with the invention.

In processes 414, portions of the bottom electrode layer 242a are removed from ILD 230, but not from the trenches. In preferred embodiments, a TEOS hardmask having a thickness of about 300 nm is deposited on the bottom electrode layer 242a using a CVD technique known in the art. The TEOS hardmask then is patterned using photolithography techniques known in the art, for example, by depositing a resist, then exposing and developing the resist. A stack etch is then conducted, typically using RIE, to etch portions of the bottom electrode layer 242a from non-capacitor areas 258, as depicted in FIG. 6A. The hardmask then is removed from the top surface of the remaining bottom electrode layer 242a using techniques known in the art.

Figure 7:
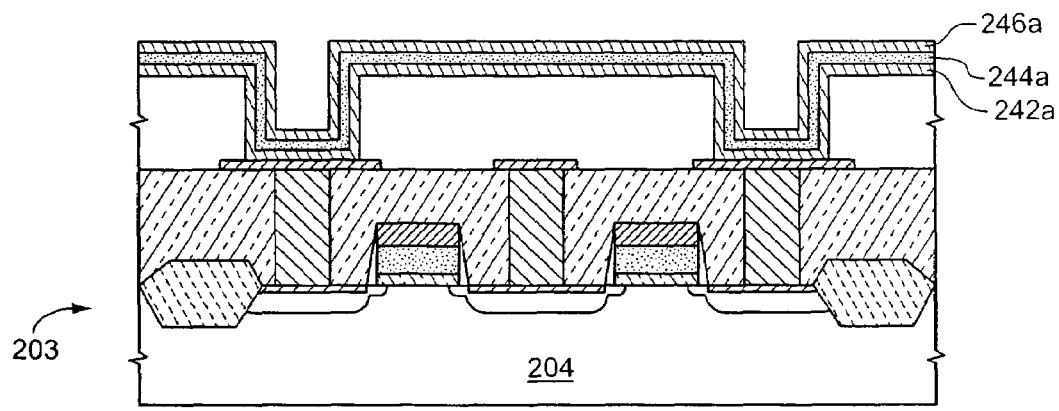
FIGS. 7 and 7A depict mutually orthogonal sectional views of the substrate of FIGS. 6, 6A in a further intermediate fabrication stage of a ferroelectric memory cell in accordance with the invention.
Figure 7A:
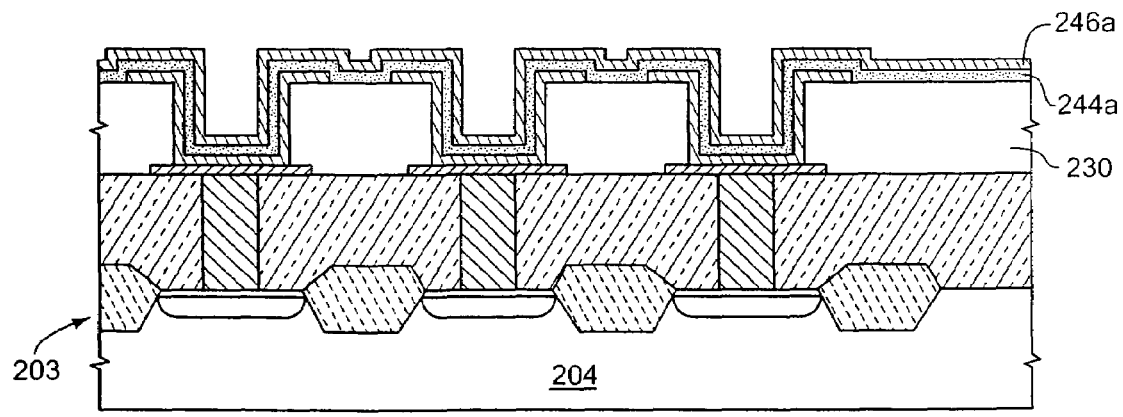

In processes 416, a conformal ferroelectric thin film layer 244a of layered superlattice material, or a thin film containing another type of capacitor dielectric, is deposited on the bottom electrode layer 242a and on non-capacitor areas 258 of second ILD 230 in accordance with the invention, as depicted in FIGS. 7, 7A. Prior to processes 416 of preferred embodiments, chemical precursors of the desired layered superlattice material are prepared. Usually, precursor solutions are prepared from commercially available solutions containing the chemical precursor compounds. If necessary, the concentrations of the various precursors supplied in the commercial solutions are adjusted to accommodate particular manufacturing or operating conditions. More preferred embodiments in accordance with the invention utilize a final liquid precursor solution containing relative molar proportions of the elements strontium, bismuth, tantalum, and niobium corresponding approximately to $SrBi_2Ta_2O_9$ (SBT), $SrBi_2(Ta_{1-x}Nb_x)_2O_9$ (SBTN), where $0 \leq x \leq 1$, and particularly $Sr_aBi_b(Ta_{1-x}Nb_x)_cO_{[9+(a-1)+(b-2)(1.5)+(c-2)(2.5)]}$, where $0.8 \leq a \leq 1$, $2 \leq b \leq 2.2$, $0 \leq x \leq 0.3$, and $1.9 \leq c \leq 2.1$. Liquid-source metal organic chemical deposition ("LSMCD") and CVD methods for preparing thin films of ferroelectric layered superlattice material have been described in the prior art, including U.S. Pat. No. 6,326,315 issued Dec. 4, 2001 to Uchiyama et al.; U.S. Pat. No. 6,245,580 issued Jun. 12, 2001 to Solayappan et al.; and U.S. Pat. No. 6,110,531 issued Aug. 29, 2000 to Paz de Araujo et al.; which are hereby incorporated by reference. In preferred embodiments, dielectric layer 244a comprising ferroelectric layered superlattice material has a thickness in a range of about from 25 nm to 300 nm, preferably about 50 nm to 60 nm. Preferably, processes 416 include a pre-top-electrode RTP treatment ("pre-TE RTP") in accordance with a preferred low-thermal-budget MOCVD method for forming layered superlattice material, as described in co-owned and co-pending U.S. patent application Ser. No. 10/302,441 filed Nov. 22, 2002, having the title "Low Thermal Budget Fabrication of Ferroelectric Memory Using RTP", which is incorporated by reference. For example, after formation of a coating on the substrate in a CVD reaction chamber, a suitable pre-TE RTP treatment in accordance with the invention includes RTP at 650° C. for 30 seconds in $O_2$ gas, with a ramping rate of 100° C. per second to form a ferroelectric film.

In processes 418, a top plate-line electrode layer 246a is deposited on ferroelectric layer 244a, as depicted in FIGS. 7, 7A. Typically, top plate-line electrode layer 246a is formed by depositing about 50 nm of platinum using a sputtering technique as known in the art. Preferably, the electrode is formed by RF sputtering of a platinum single layer, but it also may be formed by DC sputtering, ion beam sputtering, vacuum deposition, or other appropriate conventional deposition process.

Figure 8:
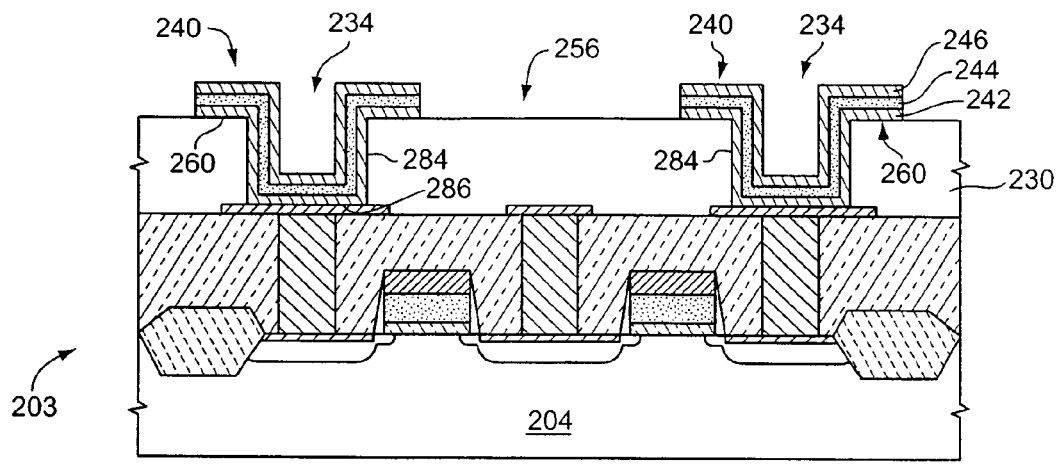
FIGS. 8 and 8A depict mutually orthogonal sectional views of the substrate of FIGS. 7, 7A in a further intermediate fabrication stage of a ferroelectric memory cell in accordance with the invention.
Figure 8A:
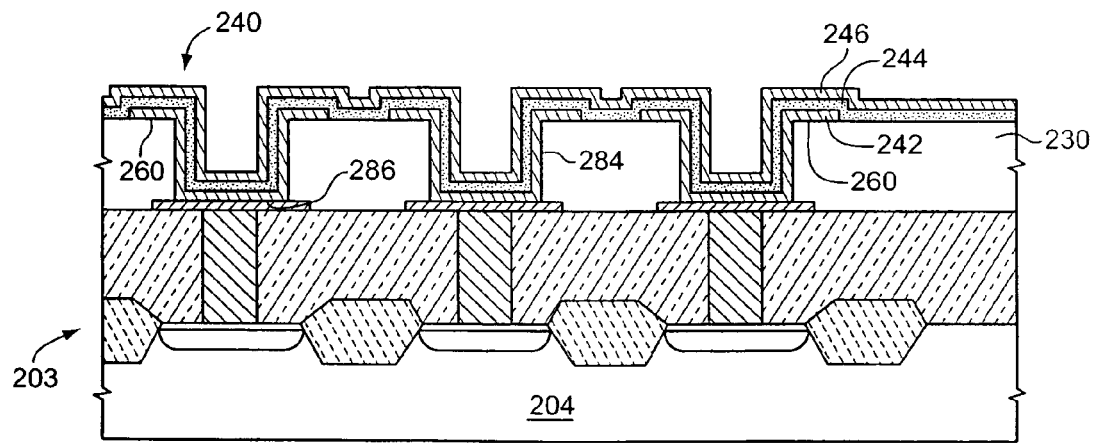

In processes 420, top plate-line electrode layer 246a and metal-oxide capacitor dielectric layer 244a are patterned and etched to remove portions of the bottom electrode layer 242a, of ferroelectric thin film layer 244a, and of top electrode layer 246a from non-capacitor areas 256 of ILD 230 and from non-memory areas 282, as depicted in FIGS. 3, 8. As a result, a conformal 3-D capacitor laminate 240 covers trench bottom 286 and trench sidewall 284 of trenches 234. A conformal capacitor laminate 240 conforms substantially to the 3-D shape of a trench 234. A conformal capacitor laminate comprises a bottom electrode 242, a thin film 244 of capacitor dielectric, and a top electrode 246, as depicted in FIGS. 8, 8A. In preferred embodiments, a TEOS hardmask having a thickness of about 300 nm is deposited on the top surface of top electrode layer 246a using a CVD technique known in the art. The TEOS hardmask then is patterned using photolithography techniques known in the art, for example, by depositing a resist, then exposing and developing the resist. A stack etch is then conducted, typically using RIE, to etch portions of top electrode layer 246a, ferroelectric thin film layer 244a, and bottom electrode layer 242a down to ILD 230. The hardmask then is removed from the top surface of top electrode 246 using techniques known in the art, typically RIE. Typically, a resulting capacitor laminate 240 slightly overlaps a portion 260 of the top surface of ILD 230.

Generally, in processes 422, a final heating of metal oxide ferroelectric thin film 244 in oxygen or nonreactive gas is conducted after etching processes 420 to achieve desired electronic properties of polycrystalline metal oxide. Preferably, a post-TE RTP treatment in accordance with a low thermal budget MOCVD method of the invention is conducted; for example, at a hold temperature of 725° C. for 2 minutes in $O_2$ gas. In preferred embodiments, capacitor dielectric 244 comprising ferroelectric layered superlattice material has a thickness in a range of about from 25 nm to 300 nm, more preferably in a range of 50 nm to 60 nm. Preferably, a thin film of ferroelectric layered superlattice material and other elements of a memory capacitor are fabricated using a low-thermal-budget MOCVD technique. Co-owned and co-pending U.S. patent application Ser. No. 10/302,441, referenced above, teaches fabrication of thin and ultra-thin films of ferroelectric layered superlattice material in nonvolatile memory capacitors.

In processes 424, third ILD 262 is formed on capacitor laminates 240 and on exposed surfaces of ILD 230 of substrate 203 by depositing approximately 500 nm NSG or doped silicate glass, typically using TEOS or other precursor in a PECVD technique, as known in the art.

In processes 426, an electrically nonconductive hydrogen barrier layer 264, as depicted in FIGS. 2, 2A, is formed on substrate 202 by depositing it on third ILD 262. As discussed with reference to FIGS. 2, 2A, and 3, nonconductive hydrogen barrier layer 264 completely covers capacitors 270. Thus, nonconductive hydrogen barrier layer 264 covers ferroelectric thin films 244 of capacitor laminates 240. Nonconductive hydrogen barrier layer 264 further covers switches 208 of integrated circuit substrate 203 (although it is ordinarily not in direct contact with switch components such as source/drain regions and gate components). Preferably, nonconductive hydrogen barrier 264 comprises strontium tantalum oxide ("strontium tantalate"), having a thickness of about 75 nm. Alternatively, nonconductive hydrogen barrier layer 264 comprises a laminate structure, which laminate structure comprises a sublayer of strontium tantalate, $SrTaO_x$, and a sublayer of silicon nitride, SiN. Preferably, strontium tantalate or a SrTaO$_x$/SiN double-layer is deposited using a MOCVD process and other techniques and structures as described in co-owned and co-pending U.S. patent application Ser. No. 09/998,469 filed Nov. 29, 2001, which is incorporated by reference. Where barrier layer 264 includes only SrTaO$_x$, a 75 nm thick layer of STO is preferably deposited employing MOCVD. Where barrier layer 264 includes both SrTaO$_x$ and SiN, a 75 nm thick sublayer of SrTaO$_x$ is preferably deposited first in a MOCVD process conducted at between 400° C. and 600° C., employing a SrTa (strontium tantalum) single source precursor. Thereafter, a layer of SiN, preferably 50 nm to 150 nm thick, is deposited, preferably employing CVD. In an alternative embodiment, the SiN portion of barrier layer 264 may be deposited first, and a layer of SrTaO$_x$ is then deposited on the SiN portion. Liquid spin-on and other liquid-source deposition techniques are also suitable for depositing strontium tantalate in accordance with the invention. Portions of nonconductive hydrogen barrier layer 264 are generally removed from non-memory areas 282 (discussed above with reference to FIG. 3) of substrate 203 in processes 426. Typically, resist is deposited and patterned using photolithographic techniques, and then an RIE technique is used to etch nonconductive hydrogen barrier layer 264 from non-memory areas 282. Both strontium tantalate and silicon nitride, alone or together, function as oxygen barriers, as well as hydrogen barriers.

In steps 428, fourth ILD 268 is formed on hydrogen barrier layer 264 of substrate 203 by depositing approximately 500 nm NSG or doped silicate glass, typically using TEOS or other precursor in a PECVD technique, as known in the art.

In processes 430, a bit-line contact via 290 is etched through ILD 268, nonconductive hydrogen barrier layer 264, ILD 262, and ILD 230 down to diffusion barrier 227, using techniques known in the art. Similarly, a plate-line contact via 292 down to top plate-line electrode 246 is etched through ILD 268, nonconductive hydrogen barrier layer 264, and ILD 262 using techniques known in the art. Preferably, via 290 and via 292 are filled with metallized wiring material, typically comprising copper, in a single metallization process that forms bit line contact 270, bit-line wiring layer 202, plate-line contact 254, and plate-line wiring layer 272. Preferably, plate-line contact 254 or other electrical connection to top plate-line electrode 246 is disposed remotely from capacitors 250, located above each of conductive plugs 222, so that the integrity of hydrogen barrier layer 264 is preserved directly above and near capacitors 250. Wiring layers 202, 272 and contact plugs 270, 254 are typically deposited by a conventional Al—Cu—Si metallization sputtering technique.

Figure 9:
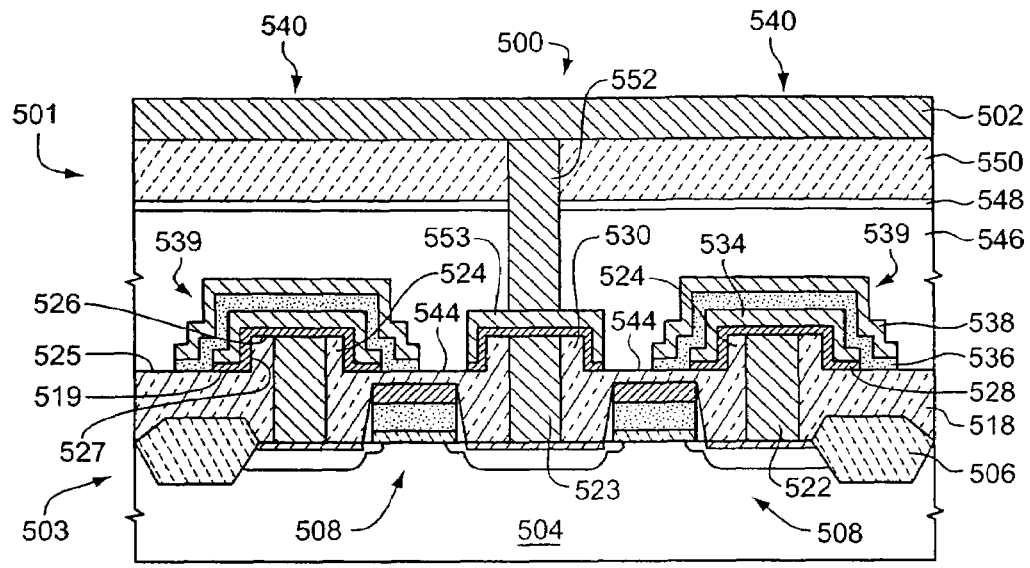
FIGS. 9 and 9A depict mutually orthogonal sectional views of an alternative embodiment of a ferroelectric memory cell in accordance with the invention, in which active elements of a ferroelectric memory capacitor have a 3-D pillar-shape including directional components substantially perpendicular to the underlying semiconductor substrate.
Figure 9A:
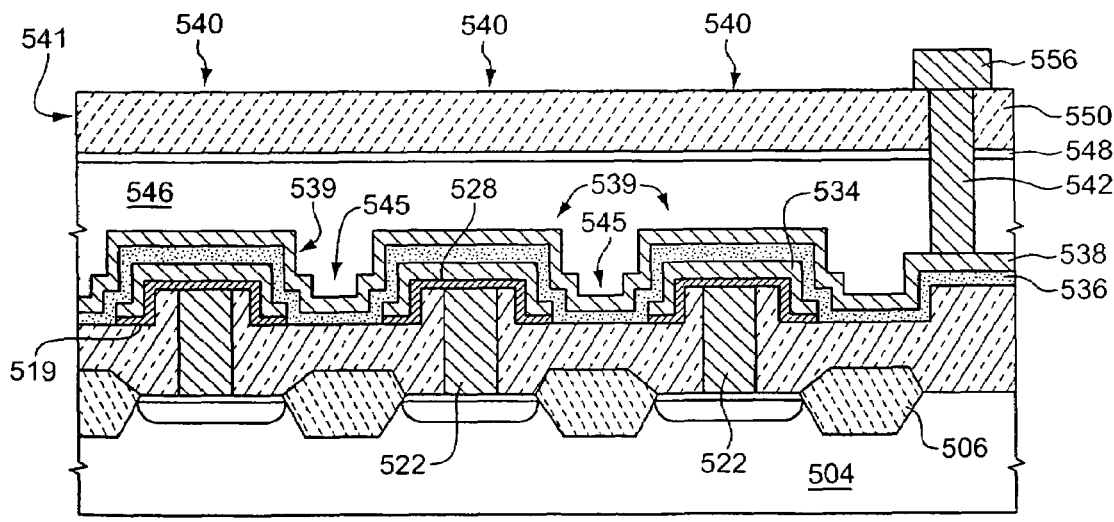

FIGS. 9, 9A depict mutually orthogonal cross-sectional views of an alternative exemplary nonvolatile ferroelectric memory 500 in accordance with the invention. Integrated circuit memory 500 comprises 3-D memory capacitors conforming to a pillar shape, instead of a trench.

FIG. 9 shows a cross-section 501 taken along the bit line 502 of integrated circuit 500. Integrated circuit 500 includes silicon semiconductor material 504, field oxide regions 506, and switches 508. Integrated circuit 500 further includes a first insulator layer 518, typically called an interlayer dielectric layer ("ILD"), disposed on substrate 503, and covering semiconductor material 504, oxide regions 506, and switches 508. First insulator layer 518 typically comprises nondoped silicate glass ("NSG") or a doped glass, such as BPSG (boron-doped phospho-silicate glass), and is typically formed using a CVD technique as known in the art. Substrate 503 further includes conductive capacitor plugs 522 and conductive bit-line plug 523. Wafer substrate 503 may comprise silicon, gallium arsenide, or other semiconductor, or an insulator, such as silicon dioxide, glass, or magnesium oxide (MgO).

In accordance with the invention, ILD 518 comprises pillar regions 524 on which memory capacitors are disposed. A pillar region 524 is formed by removing non-pillar portions of ILD 518 so that a pillar region 524 extends vertically from the non-pillar surface 525 of ILD 518. A pillar 524 comprises a pillar top 526 and a pillar sidewall 527. A conductive capacitor plug 522 is disposed in a pillar region 524 so that the bottom of a conductive capacitor plug 522 is in electrical contact with switch 508, and the top of conductive plug 522 forms at least a part of top surface 526 of pillar 524.

A conductive diffusion barrier 528 is disposed on pillar top 526, pillar sidewall 527, and usually a small overlap portion 519 on non-pillar surface 525 of ILD 518. Conductive diffusion barrier 528 is in electrical contact with conductive capacitor plug 522.

Integrated circuit 500 also comprises a bit-line pillar 530, in which bit-line plug 523 is located. A diffusion barrier 531 is typically located on bit-line pillar 530 and is in electrical contact with bit-line plug 523. Diffusion barriers 528, 531 are made of, for example, titanium nitride, and typically have a thickness of 10 nm to 20 nm. Diffusion barrier layers, such as titanium nitride, inhibit the diffusion of chemical species, particularly oxygen, between the underlying and overlying layers of memory 500.

In accordance with the invention, a 3-D bottom electrode 534 conforming to the shape of pillar 524 is disposed on diffusion barrier 528. A 3-D capacitor dielectric thin film 536 conforming to the shape of pillar 524 in accordance with the invention is disposed on bottom electrode 534. A 3-D top electrode 538 conforming to the shape of pillar 524 in accordance with the invention is disposed on dielectric thin film 536. Preferably, capacitor dielectric thin film 536 comprises ferroelectric material, most preferably, layered super lattice material as described above. In the embodiment of integrated circuit 500, 3-D top electrode 538 functions as a plate-line electrode.

Thus, in accordance with the invention, each pillar 524 is coated with a 3-D capacitor laminate 539. A capacitor laminate 539 comprises a bottom electrode 534, a ferroelectric thin film 536, and a top electrode 538. Pillar 524 is three-dimensional; that is, the shape of pillar 524 has substantial vertical components, or directional components substantially perpendicular to the horizontal plane of semiconductor substrate 504. As a result, capacitor laminate 539, which conforms substantially to the shape of pillar 524, also has a 3-dimensional shape. In preferred embodiments, top electrode 538 is a top plate-line electrode that extends substantially perpendicular to bit line 502 of FIG. 9. Capacitor laminate 539 on each pillar 524 functions as a ferroelectric memory capacitor 540 in integrated circuit 500. FIG. 9A depicts a cross-section 552 taken along a top plate-line electrode 538 of integrated circuit 500. Top plate-line electrode 538 is not planar, rather, it is a plate line in the sense that it extends continuously between a plurality of memory capacitors 540 and provides continuous electrical connection between the capacitors and a conductive plate-line connector plug 542. As depicted in FIG. 9, capacitor laminate 539 is not present on a non-capacitor area 544 of top surface 525 of ILD 518 between adjacent capacitors 540 along bit line 502. Similarly, as depicted in FIG. 9A, bottom electrode 536 is not present on non-memory area 545 between adjacent capacitors 540 along top plate-line electrode 538. As depicted in FIGS. 9, 9A, an overlap portion 519 of laminate 539 of the each capacitor 540 typically slightly overlaps non-pillar top surface 525 of ILD 530. The footprint, or horizontal surface area, of a capacitor 540 is determined essentially by the horizontal area of pillar 524 and the area of overlap portion 519. The capacitance area of capacitor 540, however, is represented approximately by the surface area of the bottom and sidewall of pillar 524 plus the area of overlap portion 519. A pillar 524 is typically patterned to have a square rectangular shape. In a square pillar having a height equal to the length of one of its sides, the surface area of its sidewall (all four square sides) is four times greater than the surface area of its top. As a result, a capacitor 540 in accordance with the invention having a footprint only one-fourth the horizontal surface area of a conventional horizontally oriented capacitor of the prior art provides approximately the same capacitance area. Similar relative proportions are obtained if pillars have circular shapes. A capacitor 540 in accordance with the invention typically comprises a bottom electrode having a thickness of about 50 nm, a ferroelectric thin film having a thickness of about 50 nm to 60 nm, and a top electrode having a thickness of about 50 nm. Thus, a corresponding capacitor laminate 539 has a thickness of about 150 nm to 170 nm. A corresponding cube-shaped pillar 524 in accordance with the invention has length, width, and depth dimensions of approximately 350 nm to 400 nm, that is, about 0.35 to 0.40 nm. A capacitor 540 in accordance with the invention typically has a footprint of approximately 0.2 nm$^2$. In contrast, a conventional memory capacitor of the prior art, as depicted in FIG. 1, typically has a footprint of about 0.8 nm$^2$ or more.

The bottom and top electrodes of ferroelectric capacitors conventionally contain platinum. It is preferable that the bottom electrode contains a non-oxidized precious metal such as platinum, palladium, silver, and gold. In addition to the precious metal, metal such as aluminum, aluminum alloy, aluminum silicon, aluminum nickel, nickel alloy, copper alloy, and aluminum copper may be used for electrodes of a ferroelectric memory. Adhesive layers (not shown), such as titanium, enhance the adhesion of the electrodes to adjacent underlying or overlying layers of the circuits.

A second interlayer dielectric layer OLD) 546 made of NSG (nondoped silicate glass) is disposed on ILD 518 and on capacitor laminates 539. A doped silicate glass, such as FSG (fluorosilicate glass), PSG (phospho-silicate glass) film, or a BPSG (boron phospho-silicate glass) film could also be used in ILD 546.

Nonconductive hydrogen barrier layer 548 is disposed on ILD 546 to cover the surface area above ferroelectric thin film 536. Typically, hydrogen barrier layer 548 is not present over non-memory areas of the integrated circuit, where there is no ferroelectric thin film 536 needing protection against reactive hydrogen.

A third interlayer dielectric layer (ILD) 550 made of NSG (nondoped silicate glass) is disposed on diffusion barrier layer 548. A doped silicate glass, such as FSG (fluorosilicate glass), PSG (phospho-silicate glass) film, or a BPSG (boron phospho-silicate glass) film could also be used in layer 550. As depicted in FIG. 9, electrically conductive bit-line connector plug 552 connects bit line 502 to switch 508 through electrode material, conductive barrier 529 and bit-line plug 523. As depicted in FIG. 9A, electrically conductive plate-line connector plug 542 connects wiring layer 556 to top plate-line electrode 538. Wirings 502, 556 preferably comprise Al—Si—Cu standard interconnect metal with a thickness of about 200 nm to 300 nm. Typically, a film of adhesion material (not shown), for example, comprising Ti and TiN, is deposited on the substrate, and wiring film 502, 556 is then formed on the adhesion film.

FIGS. 10, 10A, 11, and 11A depict intermediate stages in the fabrication of ferroelectric integrated circuit memory 500 of FIGS. 9, 9A. The diagram of FIG. 12 is a process flow sheet of a method 600 in accordance with the invention for making a ferroelectric memory 500 in accordance with the invention. Although method 600 of FIG. 12 is discussed herein with reference to FIGS. 9-11A, representing ferroelectric integrated circuit memory 500 in different of stages of fabrication, it is clear that the method 600 of FIG. 12 and numerous other embodiments of a method in accordance with the invention are useful generally for fabricating a 3-D ferroelectric memory capacitor.

Figure 10:
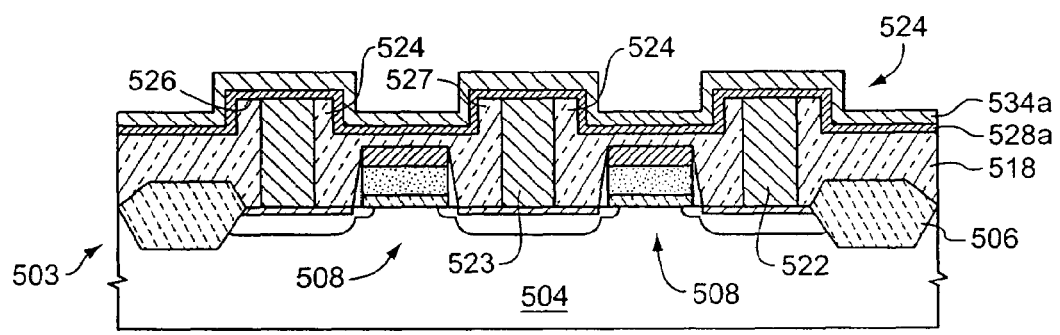
FIGS. 10 and 10A depict mutually orthogonal sectional views of an intermediate fabrication stage of a ferroelectric memory cell in accordance with the invention on the substrate of FIGS. 9, 9A.
Figure 10A:
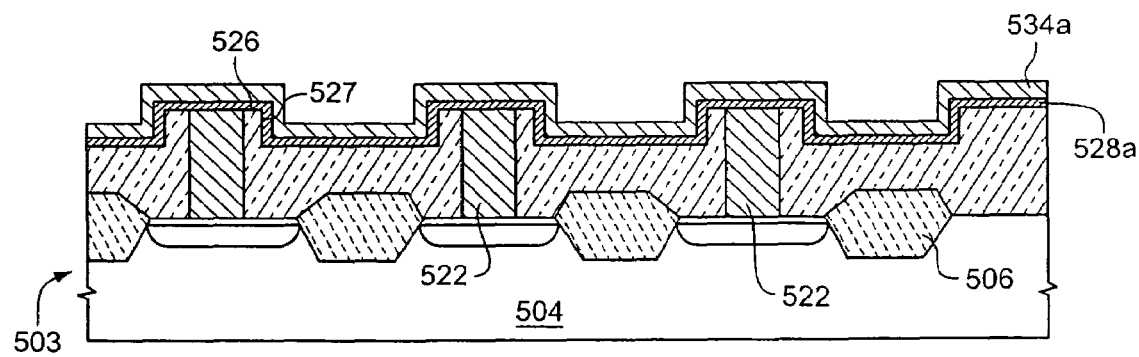

In processes 604, a substrate 503 is provided containing silicon semiconductor material 504, field oxide regions 506, switches 508, and first ILD 518 as described above with reference to FIGS. 9, 9A, and as depicted in FIGS. 10, 10A. In processes 606, first ILD 518 is patterned and etched to form vertical capacitor pillars 524 and vertical bit-line connector pillars 530. Capacitor pillars 524 have a pillar top surface 526 and pillar sidewall 527.

Typically, patterning of ILD 518 is done in a rectangular or square shape so that pillars 524 have shapes corresponding substantially to cubes or rectangular solids It is understood, however, that pillars 524 may be formed to have virtually any shape, for example, a cylindrical shape. Furthermore, standard etching techniques usually form pillars having sidewalls that are not perfectly parallel to the direction of etching; that is, that are not perfectly perpendicular to the horizontal plane of semiconductor substrate 504. As a result, the top region 526 of pillars 524 is typically narrower than a corresponding pillar bottom at non-pillar surface 525 of ILD 518. Nevertheless, a sidewall 527 and capacitor layers conforming to sidewall 527 have substantial directional components in the vertical direction, as well as in the horizontal planes at the overlap area 519 and top 526, and are therefore three-dimensional.

In processes 608, capacitor pillars 524 and bit-line pillars 530 are patterned and etched to form vias down to switches 508. in processes 610, tungsten plugs are deposited to form capacitor plugs 522 and bit-line connector plugs 523.

In processes 612, a conductive diffusion barrier layer 528a is deposited on first ILD 518, including on 3-D pillars 524, 530, as depicted in FIGS. 10, 10A. In preferred embodiments, electrically conductive oxygen-diffusion barrier layer 528a comprises a multilayer structure comprising an iridium oxide sublayer, which is on an iridium sublayer, which is on a titanium aluminum nitride sublayer, as represented by $IrO_x$/Ir/TiAlN. A preferred barrier stack is fabricated by first sputtering a sublayer of titanium aluminum nitride having a thickness of about 50 nm onto first ILD 518 and conductive plugs 522, 523, then sputtering about 100 nm iridium metal onto the nitride sublayer, and then sputtering about 100 nm of iridium oxide onto the iridium sublayer.

In processes 614, a conformal bottom electrode layer 534a is deposited on 3-D conductive diffusion barrier layer 528a, as depicted in FIGS. 10, 10A. Preferably, conformal bottom electrode layer 534a has a thickness of about 50 nm and comprises platinum. Typically, a bottom electrode layer is formed by sputtering a platinum target using techniques known in the art. Preferably, the electrode is formed by RF sputtering of a platinum single layer, but it also may be formed by DC sputtering, ion beam sputtering, vacuum deposition, or other appropriate conventional deposition process. The bottom and top electrodes of memory capacitors in accordance with the invention preferably contain platinum. Nevertheless, in certain embodiments, a bottom electrode comprises another non-oxidized precious metal, such as palladium, silver, and gold. In addition to the precious metals, a metal such as aluminum, aluminum alloy, aluminum silicon, aluminum nickel, nickel alloy, copper alloy, and aluminum copper may be used to form electrodes of a memory capacitor in accordance with the invention.

Figure 11:
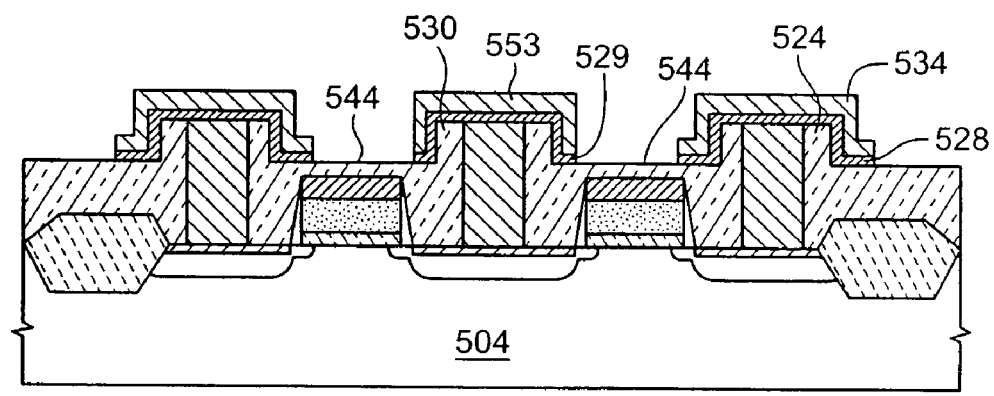
FIGS. 11 and 11A depict mutually orthogonal sectional views of the substrate of FIGS. 10, 10A in a further intermediate fabrication stage of a ferroelectric memory cell in accordance with the invention.
Figure 11A:
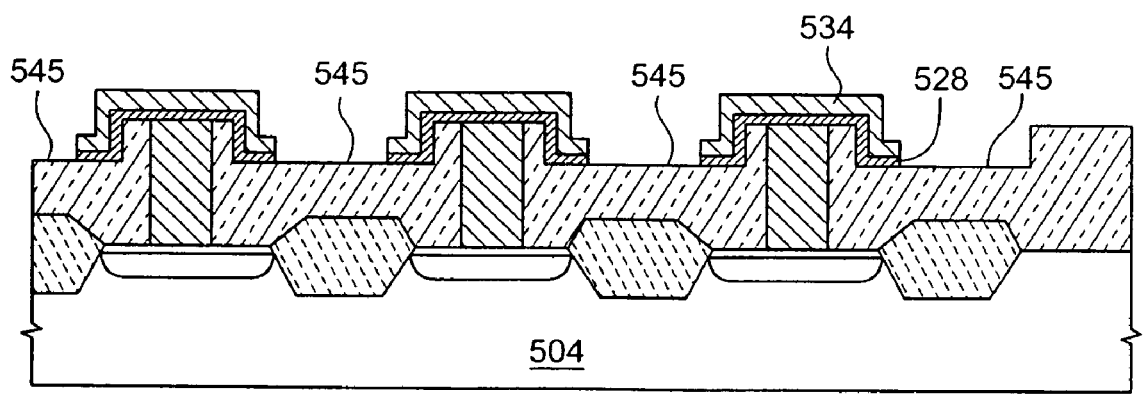
Figure 12:
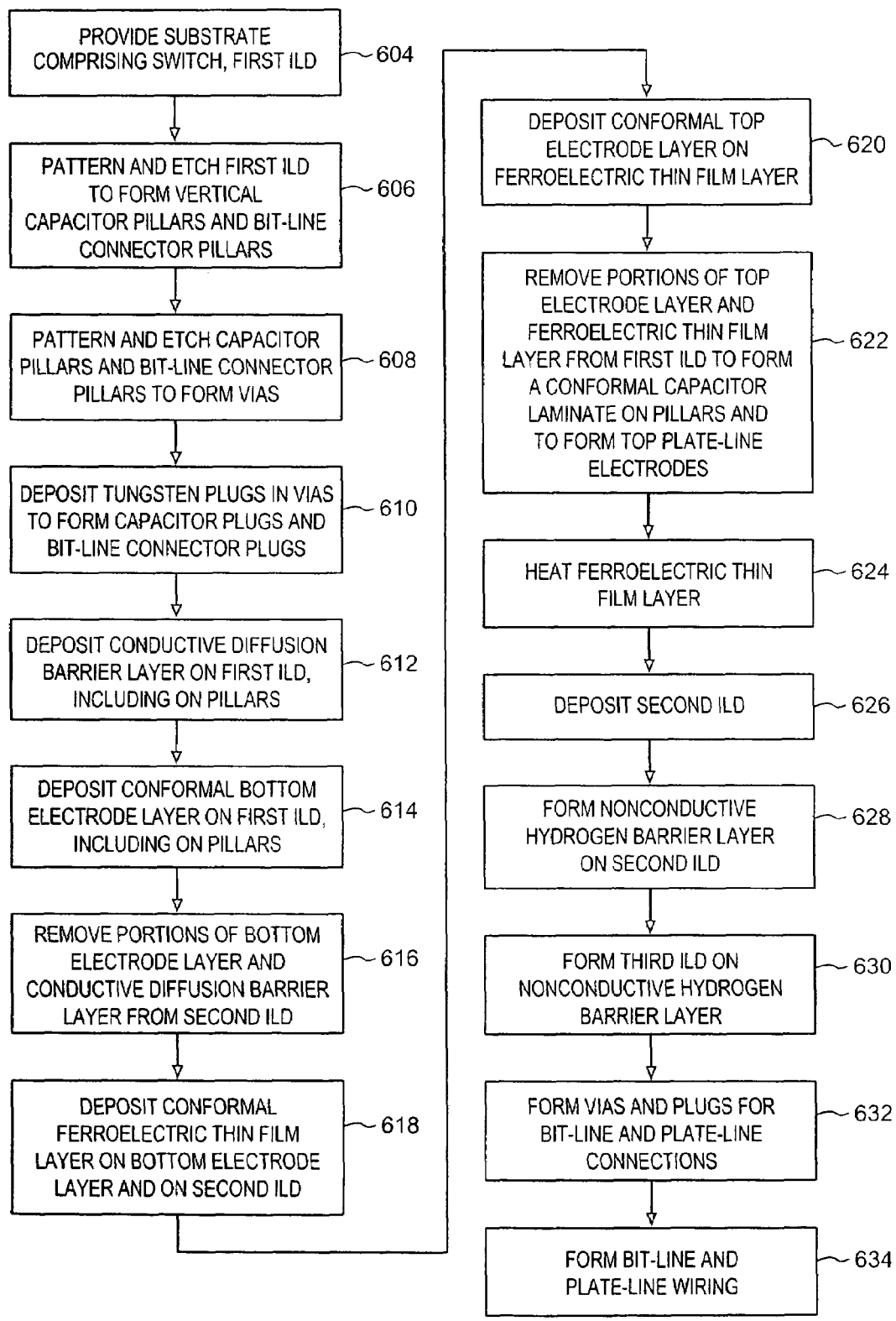
FIG. 12 contains a process flow sheet of a method for fabricating an integrated circuit having a 3-D ferroelectric memory capacitor in accordance with the invention as depicted in FIGS. 9, 9A.

In processes 616, as depicted in FIGS. 11, 11A, portions of bottom electrode layer 534a and of conductive diffusion barrier layer 528a are removed from non-capacitor portions 544 between adjacent electrodes along the bit-line direction, and from non-capacitor portions 545 adjacent to pillars along the plate-line direction, as well as from non-memory areas, such as non-memory areas 282 of FIG. 3. In processes 616, portions of the bottom electrode layer are removed from ILD 518, but not from the pillars. In preferred embodiments, a TEOS hardmask having a thickness of about 300 nm is deposited on bottom electrode layer 534a using a CVD technique known in the art. The TEOS hardmask then is patterned using photolithography techniques known in the art, for example, by depositing a resist, then exposing and developing the resist. A stack etch is then conducted, typically using RIE, to etch portions of bottom electrode layer 534a and diffusion barrier layer 528a, thereby forming diffusion barrier 528 and bottom electrode 534 on each capacitor pillar 524, and diffusion barrier 529 and electrode material 553 on bit-line pillars 530. The hardmask then is removed from the top surface of the remaining bottom electrode layer using techniques known in the art.

In processes 618, a conformal ferroelectric thin film layer 536a of layered superlattice material, or a thin film containing another type of capacitor dielectric, is deposited on bottom electrodes 534 and on non-capacitor areas 544, 545 of ILD 518 in accordance with the invention, as depicted in FIGS. 9, 9A, using techniques described above with reference to method 400. Preferably, ferroelectric thin film layer 536a has a thickness in a range of about from 25 nm to 300 nm, preferably about 50 nm to 60 nm. Particularly useful for forming an ultra-thin film of layer superlattice material is a low-thermal-budget MOCVD method, as described in co-owned and co-pending U.S. patent application Ser. No. 10/302,441 filed Nov. 22, 2002, having the title "Low Thermal Budget Fabrication of Ferroelectric Memory Using RTP", which is incorporated by reference.

In processes 620, a conformal top plate-line electrode layer 538a is deposited on ferroelectric layer 536a, as depicted in FIGS. 7, 7A. Typically, top plate-line electrode layer 538a is formed by depositing about 50 nm of platinum using a sputtering technique as known in the art.

In processes 622, portions of top electrode layer 538a and ferroelectric thin film layer 536a are removed from non-capacitor areas of 544 using patterning and etching techniques known in the art. In preferred embodiments, a TEOS hardmask having a thickness of about 300 nm is deposited on the top surface of top electrode layer 538a using a CVD technique known in the art. The TEOS hardmask then is patterned using photolithography techniques known in the art, for example, by depositing a resist, then exposing and developing the resist. A stack etch is then conducted, typically using RIE, to etch portions of top electrode layer 538a and ferroelectric thin film layer 536a down to ILD 518. The hardmask then is removed from the top surface of top electrode 538 using techniques known in the art, typically RIE. Typically, a resulting capacitor laminate 539 slightly overlaps a portion 519 of surface 525 of ILD 518. A conformal 3-D capacitor laminate 539 covers pillar top 526 and pillar sidewall 527 of pillar 524. A conformal capacitor laminate 539 conforms substantially to the 3-D shape of a pillar 524. A conformal capacitor laminate 539 comprises a bottom electrode 534, a thin film 536 of capacitor dielectric, and a top electrode 538, as depicted in FIGS. 9, 9A.

Generally, in processes 624, a final heating of metal oxide ferroelectric thin film 536 in oxygen or nonreactive gas is conducted after etching processes 622 to achieve desired electronic properties of polycrystalline metal oxide. Preferably, a post-TE RTP treatment in accordance with a low thermal budget MOCVD method of the invention is conducted.

In processes 626, second ILD 546 is formed on capacitor laminates 539 and on exposed surfaces of ILD 518 of substrate 503 by depositing approximately 500 nm NSG or doped silicate glass, typically using TEOS or other precursor in a PECVD technique, as known in the art.

In processes 628, an electrically nonconductive hydrogen barrier layer 548 is formed on substrate 502 by depositing it on second ILD 546, as depicted in FIGS. 9, 9A. As discussed with reference to FIGS. 9, 9A, nonconductive hydrogen barrier layer 548 completely covers capacitors 540. Thus, nonconductive hydrogen barrier layer 548 covers ferroelectric thin films 536 of capacitor laminates 539. Nonconductive hydrogen barrier layer 548 further covers switches 508 of integrated circuit substrate 503 (although it is not in direct contact with switch components such as source/drain regions and gate components). Preferably, nonconductive hydrogen barrier 548 comprises strontium tantalum oxide ("strontium tantalate"), having a thickness of about 75 nm. Alternatively, nonconductive hydrogen barrier layer 548 comprises a laminate structure, which laminate structure comprises a sublayer of strontium tantalate, $SrTaO_x$, and a sublayer of silicon nitride, SiN. Preferably, strontium tantalate or a $SrTaO_x$/SiN double-layer is deposited using a MOCVD process and other techniques and structures as described in co-owned and co-pending U.S. patent application Ser. No. 09/998,469 filed Nov. 29, 2001, which is incorporated by reference. Where barrier layer 564 includes only $SrTaO_x$, a 75 nm thick layer of STO is preferably deposited employing MOCVD. Where barrier layer 548 includes both $SrTaO_x$ and SiN, a 75 nm thick sublayer of $SrTaO_x$ is preferably deposited first in a MOCVD process conducted at between 400° C. and 600° C., employing a SrTa (strontium tantalum) single source precursor. Thereafter, a layer of SiN, preferably 50 nm to 150 nm thick, is deposited, preferably employing CVD. In an alternative embodiment, the SiN portion of barrier layer 548 may be deposited first, and a layer of $SrTaO_x$ is then deposited on the SiN portion. Liquid spin-on and other liquid-source deposition techniques are also suitable for depositing strontium tantalate in accordance with the invention. Portions of nonconductive hydrogen barrier layer 548 are generally removed from non-memory areas 282 (discussed above with reference to FIG. 3) of substrate 503 in processes 628. Typically, resist is deposited and patterned using photolithographic techniques, and then an RIE technique is used to etch nonconductive hydrogen barrier layer 548 from non-memory areas. Both strontium tantalate and silicon nitride, alone or together, function as oxygen barriers, as well as hydrogen barriers.

In processes 630, third ILD 550 is formed on hydrogen barrier layer 548 of substrate 503 by depositing approximately 500 nm NSG or doped silicate glass, typically using TEOS or other precursor in a PECVD technique, as known in the art.

In processes 632, a bit-line contact via is etched through ILD 550, nonconductive hydrogen barrier layer 548, and ILD 546 down to electrode material 553 at bit-line pillar 530, using techniques known in the art. Similarly, a plate-line contact via down to top plate-line electrode 538 is etched through ILD 550, nonconductive hydrogen barrier layer 548, and ILD 546, using techniques known in the art. Preferably, the vias are filled with metallized wiring material, typically comprising copper, in a single metallization process that forms bit line contact 552, bit-line wiring layer 502, plate-line contact 542, and plat line wiring layer 556. Preferably, plate-line contact 542 or other electrical connection to top plate-line electrode 538 is disposed remotely from capacitors 540, located above each of conductive plugs 522, so that the integrity of hydrogen barrier layer 548 is preserved directly above and near capacitors 540. Wiring layers 502, 556 and contact plugs 552, 542 are typically deposited by a conventional Al—Cu—Si metallization sputtering technique.

Conformal 3-D ferroelectric thin film layers formed in accordance with the invention have smooth, continuous, and uniform surfaces, even though they are not planar, and they can be reliably fabricated to have thicknesses in a range of from 25 nm to 300 nm, maintaining important structural and electrical characteristics. The reduced heating time at elevated temperature of a low-thermal-budget technique in accordance with the invention reduces the formation of hillocks and other non-uniformities at the surfaces of deposited layers. The resulting enhanced smoothness improves interfacial contacts and inhibits electrical shorting. Conformal ultra-thin MOCVD ferroelectric thin films in accordance with the invention preferably are fabricated using a method as described in co-owned and co-pending U.S. patent application Ser. No. 10/302,441 filed Nov. 22, 2002, having the title "Low Thermal Budget Fabrication Of Ferroelectric Memory Using RTP", which is incorporated by reference.

It should be understood that the specific processes and electronic devices described herein are exemplary; that is, the invention contemplates that the layers in FIGS. 2, 3, and 5-11A may be made of many other materials than those mentioned above and described below. There are many other variations of structures and methods in accordance with the invention than can be included in a document such as this, and the methods and materials may be used in many other electronic devices other than integrated circuit devices 200 and 500.

A feature of the invention is that the ferroelectric material is made of layered superlattice materials. A 3-D ferroelectric capacitor is of little use unless the ferroelectric material can be made very thin. Otherwise, the footprint of the capacitor will remain very large. It has been found that layered superlattice materials, unlike other ferroelectric materials, can be made extremely thin while still retaining a high enough polarizability and other electrical properties to make an effective memory.

A related feature of the invention is that the capacitor laminate and the ferroelectric materials are very thin. Now that it has been shown that layered superlattice materials can be made very thin and retain their electrical properties, those skilled in the art may be able to use the methods of the invention, such as very low thermal budgets, to make extremely thin films out other ferroelectric materials, and thus make the memory out of other ferroelectric materials.

There have been described structures and methods for making electronic devices containing 3-D memory capacitors, in particular, 3-D ferroelectric memory capacitors. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, even though a low thermal budget in accordance with the invention is achieved to a significant degree through the use of RIP heating, it is conceivable that furnace-heating could be conducted for a portion of the cumulative heating time in an embodiment in accordance with the invention. It is also evident that the steps recited may in some instances be performed in a different order, or equivalent structures and processes may be substituted for the various structures and processes described; or a variety of different precursors may be used. Consequently, the invention is to be construed as embracing each and every novel feature and novel combination of features present in and/or possessed by the fabrication processes, electronic devices, and electronic device manufacturing methods described and by their equivalents.

What is claimed as new and desired to be protected by Letters Patent of the United States is:

1. A method of forming a ferroelectric memory in an integrated circuit substrate, comprising:
    providing an integrated circuit substrate including a bottom electrode having a three- dimensional (3-D) shape having substantial directional components in three mutually orthogonal planes;
    placing said integrated circuit substrate in a chemical vapor deposition chamber;
    depositing a conformal ferroelectric thin film on said bottom electrode using a chemical vapor deposition process; and
    depositing a conformal top electrode layer conforming to said ferroelectric thin film layer, wherein said depositing a conformal ferroelectric thin film layer comprises depositing a ferroelectric thin film layer having a thickness not exceeding 80 nm.

2. A method as in claim 1 wherein said integrated circuit substrate includes an insulator layer, a portion of which insulator layer forms a three-dimensional ("3-D") insulator surface, and said providing comprises depositing said bottom electrode layer conforming to said 3-D insulator surface.

3. A method as in claim 2 wherein said integrated circuit substrate includes a switch and said insulator layer is formed above said switch.

4. A method as in claim 1, further comprising processes of removing a portion of said top electrode layer, a portion of said ferroelectric thin film layer, and a portion of said bottom electrode layer to form a 3-D capacitor laminate including a top electrode, a ferroelectric film and a bottom electrode.

5. A method as in claim 1 wherein said depositing a conformal ferroelectric thin film layer comprises depositing a ferroelectric thin film layer having a thickness not exceeding 60 nm.

6. A method as in claim 1 wherein said depositing a conformal ferroelectric thin film layer is conducted using a low-thermal-budget MOCVD technique.

7. A method as in claim 4 wherein said using a MOCVD technique comprises:
    flowing a metal organic precursor into a MOCVD reaction chamber containing said integrated circuit substrate to form a coating on said conformal bottom electrode layer, said precursor containing metal atoms in effective amounts for forming said ferroelectric thin film layer; and
    heating said substrate including said coating using rapid thermal processing at a temperature in a range of about from 500° C. to 900° C. for a cumulative heating time not exceeding 30 minutes.

8. A method as in claim 7, further characterized in which said cumulative heating time does not exceed five minutes.

9. A method as in claim 7, further characterized by not heating said substrate in a furnace.

10. A method as in claim 7 wherein said heating said substrate comprises:
conducting a pre-TE RTP treatment of said substrate including said coating before said depositing said top electrode layer; and
wherein said heating said substrate further comprises conducting a post-TE RTP treatment after said depositing said top electrode layer.

11. A method as in claim 10, further comprising processes of removing a portion of said top electrode layer, a portion of said ferroelectric thin film layer, and a portion of said bottom electrode layer to form a 3-D capacitor laminate including a top electrode, a ferroelectric film, and a bottom electrode before conducting said post-TE RTP treatment.

12. A method as in claim 10 wherein said conducting said post-TE RTP treatment is done in a nonreactive gas.

13. A method as in claim 1 wherein said depositing comprises depositing a layered superlattice material.

* * * * *